(12) United States Patent
Arikawa

(10) Patent No.: US 12,009,868 B2
(45) Date of Patent: Jun. 11, 2024

(54) COEFFICIENT UPDATE AMOUNT OUTPUT DEVICE, COEFFICIENT UPDATE DEVICE, COEFFICIENT UPDATE AMOUNT OUTPUT METHOD, AND RECORDING MEDIUM

(71) Applicant: NEC Corporation, Tokyo (JP)

(72) Inventor: Manabu Arikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/766,296

(22) PCT Filed: Sep. 11, 2020

(86) PCT No.: PCT/JP2020/034526
§ 371 (c)(1),
(2) Date: Apr. 4, 2022

(87) PCT Pub. No.: WO2021/079647
PCT Pub. Date: Apr. 29, 2021

(65) Prior Publication Data
US 2024/0056195 A1    Feb. 15, 2024

(30) Foreign Application Priority Data
Oct. 21, 2019    (JP) ................... 2019-191623

(51) Int. Cl.
H04B 10/61      (2013.01)

(52) U.S. Cl.
CPC ....... H04B 10/612 (2013.01); H04B 10/6165 (2013.01)

(58) Field of Classification Search
None
See application file for complete search history.

(56) References Cited

U.S. PATENT DOCUMENTS 8,515,293 B2 * 8/2013 Yasuda ............... H04B 10/65
                                                           398/208
9,014,574 B2    4/2015   Arikawa et al.
(Continued)

FOREIGN PATENT DOCUMENTS

| WO | 2012/118215 A1 | 9/2012 |
|---|---|---|
| WO | 2018/198891 A1 | 11/2018 |
| WO | 2019/198465 A1 | 10/2019 |

OTHER PUBLICATIONS

International Search Report for PCT Application No. PCT/JP2020/034526, dated Dec. 8, 2020.
(Continued)

*Primary Examiner* — David W Lambert
(74) *Attorney, Agent, or Firm* — Sughrue Mion, PLLC

(57) ABSTRACT

In order to suppress wrong convergence of a filter coefficient without reducing data communication speed, this filter coefficient update amount output device is provided with: a first output unit which outputs a first coefficient update amount derived from a difference between a temporary determination result regarding a processed reception sample value that is the reception sample value on which filter processing by a digital filter has been performed and the processed reception sample value; a second output unit which outputs a second coefficient update amount derived from a gradient with respect to the filter coefficient such that the magnitude of a difference between statistical information on the processed reception sample value during some duration of time, and a set value regarding the statistical information is minimized; and a third output unit which outputs the coefficient update amount derived from the first coefficient update amount and the second coefficient update amount.

20 Claims, 16 Drawing Sheets

(56) References Cited

U.S. PATENT DOCUMENTS

| | | | | |
|---|---|---|---|---|
| 2009/0245816 A1* | 10/2009 | Liu | ................... | H04B 10/616 |
| | | | | 398/208 |
| 2013/0251370 A1* | 9/2013 | Ogasahara | ......... | H04B 10/6162 |
| | | | | 398/65 |
| 2013/0336654 A1* | 12/2013 | Arikawa | ............ | H04B 10/6166 |
| | | | | 398/65 |
| 2014/0328585 A1* | 11/2014 | Arikawa | ............ | H04B 10/6162 |
| | | | | 398/208 |
| 2020/0044737 A1 | 2/2020 | Arikawa et al. | | |
| 2021/0159976 A1 | 5/2021 | Arikawa et al. | | |

OTHER PUBLICATIONS

English translation of Written opinion for PCT Application No. PCT/JP2020/034526, dated Dec. 8, 2020.

J. Cho and P. J. Winzer, "Probabilistic Constellation Shaping for Optical Fiber Communication" J. of Lightwave Technol. 37(6), 1590 (2019), pp. 1-18.

S. J. Savory, "Digital filters for coherent optical receivers" Opt. Express 16(2), 804 (2008), pp. 1-14.

C. E. Shannon, "A mathematical theory of communication," Bell Syst. Tech. J., vol. 27, pp. 379-423 and 623-656, (1948).

Ezra Ip et al., "Coherent delection in optical fiber systems," Opt. Express 16(2). 753 (2008), pp. 1-39.

K. Kikuchi, "Fundamentals of coherent optical fiber communications," J. of Lightwave Technology 34(1), 157 (2016), pp. 157-179.

\* cited by examiner

COEFFICIENT UPDATE AMOUNT OUTPUT DEVICE, COEFFICIENT UPDATE DEVICE, COEFFICIENT UPDATE AMOUNT OUTPUT METHOD, AND RECORDING MEDIUM

This application is a National Stage Entry of PCT/JP2020/034526 filed on Sep. 11, 2020, which claims priority from Japanese Patent Application 2019-191623 filed on Oct. 21, 2019, the contents of all of which are incorporated herein by reference, in their entirety.

TECHNICAL FIELD

The present invention relates to an equalization technique upon reception during optical communication.

BACKGROUND ART

Introduction of a coherent reception technique and a digital signal processing technique into optical communication has enabled adoption of a multi-level QAM modulation and polarization multiplexing technique for achieving high spectral utilization efficiency and flexible equalization processing at a receiving side. In recent years, PCS, as disclosed in NPL 1, has been drawing attention as a technique that achieves a communication speed close to the Shannon limit by improving performance compared to ordinary multi-level QAM modulation. Herein, PCS stands for Probabilistic Constellation Shaping. It is known that, when a transmission route configures an additive Gaussian noise channel, signal points of an input signal that achieves the Shannon limit are in a continuous Gaussian distribution (refer to NPL 3). However, a modulation method in which signal points are in a continuous Gaussian distribution is not realistic. Therefore, PCS aims to achieve a continuous Gaussian distribution of signal points in an approximate manner by changing a generation probability of each signal point, based on multi-level QAM modulation.

FIGS. 1A, 1B, and 1C are diagrams illustrating examples of a probability distribution of generation of signal points of a 64QAM-based PCS signal. In FIGS. 1A to 1C, a magnitude of the generation probability of each of 8×8=64 signal points on an I-Q coordinate is expressed as a height on an I-Q plane.

FIG. 1A illustrates a case, similar to a normal 64QAM, where the generation probability of all the signal points is constant. Meanwhile, in FIGS. 1B and 1C, the generation probability of signal points is uneven, similar to a Gaussian distribution. In the cases of FIGS. 1B and 1C, since the generation probability of signal points resembles the Gaussian distribution as described above, a communication speed close to the Shannon limit can be achieved compared to a normal QAM signal.

Another characteristic of the PCS is that, by changing a shape of a distribution of the generation probability of signal points, a communication speed can be adjusted to the fastest achievable according to a signal-to-noise ratio (SNR) of a transmission route. In the example in FIGS. 1A, 1B, and 1C, FIG. 1A being similar to a normal 64QAM has the highest entropy of signal points and communication speed. Then, toward FIGS. 1B and 1C, the communication speed becomes lower and transmission at lower SNR becomes possible. The communication speed adjustment by changing the shape of the distribution of the generation probability of signal points has an advantage of being achievable without major system configuration modification, compared to a method such as changing an encoding rate of an error correction code.

In the PCS signal, signal points similar to those of an ordinary QAM signal are used. Therefore, when the PCS signal is used, digital signal processing for the ordinary QAM signal can be basically utilized for demodulation on a receiver side, such as equalization, polarization division, and carrier phase compensation.

An optical communication system that is considered to be general for using the PCS signal is described. FIG. 2 is a conceptual diagram illustrating a configuration example of a general optical communication system using the PCS signal. The optical communication system 100 includes an optical transmitter 110, a transmission route 120, and an optical receiver 130.

The optical transmitter 110 includes an encoding unit 111, an LD 112, and an optical modulator 113. Herein, LD stands for Laser diode.

The encoding unit 111 inputs encoded data being encoded from input data to the optical modulator 113. The encoded data are divided into 4 series, for example, and input to the optical modulator 113 in parallel. Herein, description of FIG. 2 is interrupted and a configuration example of the encoding unit 111 is described.

FIG. 3 is a conceptual diagram illustrating a configuration example of the encoding unit 111 illustrated in FIG. 2.

Since the encoding unit 111 generates a PCS signal based on a polarization-division multiplexed 64QAM, the encoding unit 111 generates 4 series of signals being orthogonal phase amplitudes I and Q of a first polarized wave (X polarized wave) and a second polarized wave (Y polarized wave). Herein, I stands for In-phase. Q stands for Quadrature.

The encoding unit 111 includes an SP unit 21 and sub-encoding units 22a to 22d. Herein, SP stands for Serial/Parallel conversion.

The sub-encoding unit 22a includes an SP unit 23, a DM unit 24, an FEC encoding unit 25, and a MAP unit 26. Herein, DM stands for Distribution matcher. FEC stands for Forward Error Correction. Each of the sub-encoding units 22b to 22d has a similar configuration to the sub-encoding unit 22a.

The SP unit 21 converts input binary data to 4 series of parallel data. Each of the 4 series of data are input to each of the sub-encoding units 22a to 22d in parallel.

The SP unit 23, the input data into amplitude data to be used for configuring an amplitude and positive and negative data to be used for configuring a sign of the amplitude data, and the amplitude data are input to the DM unit 24. The DM unit 24 performs DM for the input amplitude data. The DM unit 24 uses a constant composition distribution matching algorithm for the DM, for example.

The FEC encoding unit 25 performs FEC encoding to the DM data input from the DM unit 24 and the positive and negative data input from the SP unit 23. As described above, FEC stands for Forward Error Correction. The DM data and the positive and negative data after FEC encoding are input to the MAP unit 26.

The MAP unit 26 performs mapping to QAM data by using the FEC-encoded DM data and positive and negative data, and generates PCS data. The generated PCS data are input to the optical modulator 113 illustrated in FIG. 2.

Herein, return to the description of FIG. 2.

The LD 112 illustrated in FIG. 2 inputs a laser beam being CW light to the optical modulator 113. Herein, CW stands for Continuous wave.

The optical modulator 113 modulates the CW light input from the LD 112 by using the encoded data input from the encoding unit 111. The modulated optical signal is transmitted toward the optical receiver 130 via the transmission route 120.

The transmission route 120 transmits the optical signal input from the optical transmitter 110 to the optical receiver 130. The transmission route 120 is an optical transmission route constituted of, for example, an optical fiber, an EDFA, and the like. Herein, EDFA stands for Erbium Doped optical Fiber Amplifier.

The optical receiver 130 includes an LD 131, a coherent receiver 132, an ADC 133, and a demodulation and decoding unit 134. Herein, ADC stands for analog-to-digital converter.

The LD 131 inputs LD light to the coherent receiver 132 as a so-called local oscillator.

The coherent receiver 132 is, for example, a polarization diversity coherent receiver. The coherent receiver 132 uses the LD light input from the LD 131, performs wave detection of the optical signal transmitted from the optical transmitter 110 via the transmission route 120, and inputs 4 series of received signals related to the orthogonal phase amplitude of each polarized wave, to the ADC 133.

The ADC 133 converts each of the input 4 series of analog signals to 4 series of digital received sample values by means of sampling, and inputs the digital received sample values to the demodulation and decoding unit 134. A sampling speed of the sampling is, for example, twice a symbol rate.

The demodulation and decoding unit 134 performs demodulation and decoding signal processing in a digital domain for each of the input 4 series of received sample values. The demodulation and decoding unit 134 restores data transmitted from the optical transmitter 110 by means of the signal processing and outputs the result.

FIG. 4 is a conceptual diagram illustrating a configuration example of the demodulation and decoding unit 134 illustrated in FIG. 2. The demodulation and decoding unit 134 includes a demodulation unit 31, sub-decoding units 32a to 32d, and a PS unit 35. Herein, PS stands for Parallel/Serial conversion.

The sub-decoding unit 32a includes an FEC decoding unit 33 and a DDM unit 34. Herein, DDM stands for Distribution dematcher. Each of the sub-decoding units 32b to 32d has a similar configuration to the sub-decoding unit 32a.

4 series of received sample values are input to the demodulation unit 31 from the ADC 133 in FIG. 2. The demodulation unit 31 demodulates each of the received sample values. The 4 series of demodulated received sample values are input to the sub-decoding units 32a to 32d. A specific example of the demodulation unit 31 is illustrated in FIG. 5 and description thereof is described later.

A hardware configuration of the demodulation and decoding unit 134 includes a computer and a processor, and processing performed by the demodulation unit 31 is typically executed by a program or information.

The FEC decoding unit 33 performs FEC decoding for an input received sample value. The FEC decoding unit 33 inputs the received sample value after decoding to the DDM unit 34.

The DDM unit 34 performs DDM for the input received sample value after FEC decoding. The received sample value after the DDM is input to the PS unit 35.

The PS unit 35 converts parallel received sample values being decoded by each decoding unit to serial received data and outputs the result. The received data are relevant to the data input to the SP unit 21 in FIG. 3.

FIG. 5 is a conceptual diagram illustrating a configuration example of the demodulation unit 31 illustrated in FIG. 4. The demodulation unit 31 includes a front-end compensation unit 81, a chromatic dispersion compensation unit 82, and an adaptive equalization unit 83.

The front-end compensation unit 81 compensates for distortion caused by reception front-end such as skew, for each of the 4 series of received sample values being input from the ADC 133. The front-end compensation unit 81 inputs each of the received sample values after compensation to the chromatic dispersion compensation unit 82.

The chromatic dispersion compensation unit 82 compensates for chromatic dispersion accumulated in the transmission route for each polarized wave of each of the input received sample values. The chromatic dispersion compensation unit 82 inputs each of the received sample values after compensation to the adaptive equalization unit 83.

The adaptive equalization unit 83 performs equalization, polarization division, and polarization mode dispersion compensation by adaptive equalization for each of the input received sample values. The adaptive equalization unit 83 outputs the received sample values after adaptive equalization to the sub-decoding units 32a to 32d.

FIG. 6 is a block diagram illustrating an adaptive equalization processing example to be performed by the adaptive equalization unit 83 illustrated in FIG. 5.

Each of the received sample values $x_{1I}$, $x_{1Q}$, $x_{2I}$, and $x_{2Q}$ being 4 series of received sample values are input to the adaptive equalization unit 83 from the chromatic dispersion compensation unit in FIG. 5. The received sample value $x_{1I}$ is a received sample value regarding an in-phase carrier wave of a first polarized wave (X polarized wave). The received sample value $x_{1Q}$ is a received sample value regarding a quadrature carrier wave of the first polarized wave. The received sample value $x_{2I}$ is a received sample value regarding an in-phase carrier wave of a second polarized wave (Y polarized wave) that makes a right angle with the first polarized wave. The received sample value $x_{2Q}$ is a received sample value regarding a quadrature carrier wave of the second polarized wave (X polarized wave).

The adaptive equalization unit 83 converts the received sample values $x_{1I}$ and $x_{1Q}$ to a complex number $(x_{1I})+i(x_{1Q})$, and the received sample values $x_{2I}$ and $x_{2Q}$ to a complex number $(x_{2I})+i(x_{2Q})$ as complexification 10.

The adaptive equalization unit 83 performs FIRF 11a and 11b for the complex number $(x_{1I})+i(x_{1Q})$, and performs FIRF 11c and 11d for the complex number $(x_{2I})+i(x_{2Q})$, respectively. Herein, FIRF stands for finite impulse response filter processing.

A left downward arrow illustrated in each of the FIRF 11a to 11d indicates that a filter coefficient $h_{ij}$ (i and j are 1 or 2) is updated by the adaptive equalization unit 83.

The adaptive equalization unit 83 generates a complex number $(y_{1I})+i(y_{1Q})$ by performing addition 15a for adding output from the FIRF 11a and output from the FIRF 11c. Meanwhile, the adaptive equalization unit 83 generates a complex number $(y_{2I})+i(y_{2Q})$ by performing addition 15b for adding output from the FIRF 11a and output from the FIRF 11c.

Then, the adaptive equalization unit 83 performs carrier phase compensation as carrier phase compensation 13a for the complex number $(y_{1I})+i(y_{1Q})$ and generates a complex number $(y'_{1I})+i(y'_{1Q})$. The carrier phase compensation is performed in order to compensate for a phase difference between signal light and a local oscillator. The carrier phase compensation is performed by means of a phase-locked loop (PLL) or the like. The carrier phase compensation is described in NPLs 4 and 5, for example.

Then, the adaptive equalization unit 83 performs carrier phase compensation as carrier phase compensation 13b for the complex number $(y_{2I}+i(y_{2Q}))$, and generates a complex number $(y'_{2I}+i(y'_{2Q}))$.

The adaptive equalization unit 83 separates real and imaginary parts of each of the input complex numbers $(y'_{1I}+i(y'_{1Q}))$ and $(y'_{2I}+i(y'_{2Q}))$ as real and imaginary parts separation 14. The adaptive equalization unit 83 then outputs the 4 series of received sample values of the received sample values $y'_{1I}$, $y'_{1Q}$, $y'_{2I}$, and $y'_{2Q}$.

The adaptive equalization unit 83 performs equalization, polarization division, and carrier phase compensation as described above. The output 4 series of received sample values are divided as an orthogonal phase amplitude of each of the first polarized wave and the second polarized wave, for decoding performed later.

The adaptive equalization unit 83 also derives a coefficient update amount $\Delta h_{ij}$ for updating a filter coefficient $h_{ij}$ to be used for each FIRF, as coefficient update 12, in parallel with the processing described above. The adaptive equalization unit 83 uses complex numbers $(x_{1I}+i(x_{1Q}))$ and $(x_{2I}+i(x_{2Q}))$, and complex numbers $(y_{1I}+i(y_{1Q}))$ and $(y_{2I}+i(y_{2Q}))$ for the derivation. The adaptive equalization unit 83 further uses a phase difference $\Phi_i$ generated for each of the input received sample values acquired by the carrier phase compensation 13a and 13b for the derivation.

The coefficient update amount $\Delta h_{ij}$ is a value for increasing or decreasing the filter coefficient $h_{ij}$ at the time by updating. Herein, each of the subscripts i and j is 1 or 2. The adaptive equalization unit 83 updates the filter coefficient $h_{ij}$ at the time by increasing or decreasing the derived coefficient update amount $\Delta h_{ij}$.

Next, derivation processing of the aforementioned coefficient update amount included in the coefficient update 12 will be described. Update of the filter coefficient $h_{ij}$ is performed in an adaptive manner. Decision directed least mean square (DDLMS) described in NPL 2 is known as an algorithm for updating the filter coefficient $h_{ij}$ in an adaptive manner, for example. When each of 2 series of received sample values being input to each FIRF as a complex number is $x_j$, and each of received sample values being output from the FIRF as a real part and an imaginary part is $y_i$, a relation thereof is described as follows. Herein, each of the subscripts i and j is either 1 or 2.

$$y_i[k] = \sum_j h_{ij}^T x_j[k] = \sum_{j,m} h_{ij}[m] x_j[k-m] \qquad \text{Equation 1}$$

Herein, k is an integer representing discrete time and also symbol timing. m is an integer representing discrete time. T represents transposition.

In the DDLMS, for a difference between the received sample value $y_i$ at the symbol timing and the temporary determination result $d_i$ expressed with the following equation:

$$\varepsilon_i = d_i - y_i \qquad \text{Equation 2}$$

the filter coefficient $h_{ij}$ is updated in such a way as to minimize the expected value of the cost of the difference expressed as follows.

$$\varepsilon_i^2$$

This is performed by means of a stochastic gradient descent method. In other words, each filter coefficient $h_{ij}$ is updated as the expression below:

$$h_{ij} \to h_{ij} - \alpha \frac{\partial \varepsilon_i^2}{\partial h_{ij}} \qquad \text{Expression 3}$$

Herein, $$\frac{\partial}{\partial h_{ij}} = \left( \frac{\partial}{\partial Re[h_{ij}[0]]} + i\frac{\partial}{\partial Im[h_{ij}[0]]}, \cdots, \frac{\partial}{\partial Re[h_{ij}[M-1]]} + \frac{\partial}{\partial Im[h_{ij}[M-1]]} \right)^T \qquad \text{Equation 4}$$

The derivative is calculated as follows.

$$h_{ij} \to h_{ij} + \mu \varepsilon_i x_j^* \qquad \text{Expression 5}$$

When a phase offset or a frequency offset exists in the input received sample value, the temporary determination without any change is not successful. Therefore, a received sample value with carrier phase compensation is used for the temporary determination.

The second term on the right side of the expression 3 is derived as described above, as the coefficient update 12. Hereinbelow, the second term on the right side is the aforementioned coefficient update amount $\Delta h_{ij}$.

FIG. 7 is a block diagram illustrating a processing example of coefficient update amount derivation to be performed by the adaptive equalization unit 83. The coefficient update amount derivation processing is processing of deriving the aforementioned coefficient update amount $\Delta h_{ij}$.

The received sample value $x_j$ illustrated in FIG. 9 is a received sample value to be input to the filter. The received sample value $y_i$ is a sample value of the filter output. The phase difference $\Phi_i$ is a phase difference derived when the carrier phase compensation 13a or 13b in FIG. 6 is performed for the received sample value $y_i$.

The adaptive equalization unit 83 performs temporary determination 41 by using the received sample value $y_i$ and the phase difference $\Phi_i$. The temporary determination 41 is similar to symbol determination of a normal QAM signal.

Then, the adaptive equalization unit 83 performs subtraction 42, in which the received sample value $y_i$ is subtracted from a result of the temporary determination 41. The adaptive equalization unit 83 performs multiplication 43, in which the received sample value $x_j$ is multiplied by the value after the subtraction 42.

The value acquired by the multiplication 43 is multiplied by $\mu$ as constant multiplication 44, and is output as the coefficient update amount $\Delta h_{ij}$ of the filter coefficient $h_{ij}$.

The adaptive equalization and the polarization division by means of DDLMS are performed in a blind manner, without directly using transmitted information. Therefore, when performing the adaptive equalization with the DDLMS for a PCS signal, a problem may occur depending on a condition.

FIG. 8 is a constellation diagram illustrating a failure case of adaptive equalization with the DDLMS. The constellation diagram is concerning a received symbol after performing carrier phase compensation for the first polarized wave (X polarized wave). The transmitted PCS signal is the probability distribution in FIG. 1C. The transmitted PCS signal has lower entropy of signal points, and a higher generation probability of signal points near the center, compared to the normal 64QAM that equally generates signal points. Similarly, the constellation diagram in FIG. 8 needs to be, for demodulation, a distribution in which a probability of signal points near the center is higher, however, the distribution is not so, and it can be seen that overall phase offset and amplitude magnitude deviate from desired values. The reason is that, the entropy at the signal points of the transmitted PCS signal is low, and therefore only a small number of signal points out of the 64QAM signal points are used mainly, and other signal points are rarely generated, thus, in a viewpoint of temporary determination for the 64QAM, a difference between the received symbol and the temporary determination result is nearly nonexistent even in a constellation such as FIG. 8.

When the filter coefficient $h_{ij}$ converges in such a way as to generate such a constellation, the DDLMS cannot resolve the case, since the result is a local solution from a viewpoint of a cost to be minimized in the DDLMS. The constellation shift leads to an abnormality in decoding processing of the later phases.

In order to resolve the problem, instead of the DDLMS performing temporary determination, causing the filter coefficient $h_{ij}$ to converge by means of a Data-aided least mean square (LMS) using a known training pattern in advance is considered to be effective.

CITATION LIST

Non Patent Literature

[NPL 1] J. Cho and P. J. Winzer, "Probabilistic Constellation Shaping for Optical Fiber Communication" J. of Lightwave Technol. 37(6), 1590 (2019).
[NPL 2] S. J. Savory, "Digital filters for coherent optical receiver" Opt. Express 16(2), 804 (2008).
[NPL 3] C. E. Shannon, "A mathematical theory of communication," Bell Syst. Tech. J., vol. 27, pp. 379-423 and 623-656, (1948).
[NPL 4] E. Ip et al., "Coherent detection in optical fiber systems," Opt. Express 16(2), 753 (2008).
[NPL 5] K. Kikuchi "Fundamentals of coherent optical fiber communications," J. of Lightwave Technology 34(1), 157 (2016).

SUMMARY OF INVENTION

Technical Problem

However, the Data-aided LMS method generally needs to insert a training pattern at regular intervals in order to follow variating transmission route conditions, and the insertion of the training pattern decreases possible data communication speed.

A purpose of the present invention is to provide a filter coefficient update amount output device and the like that are able to suppress wrong convergence of a filter coefficient without reducing data communication speed.

Solution to Problem

A filter coefficient update amount output device according to the present invention is a filter coefficient update amount output device configured to output a coefficient update amount being a value for updating a filter coefficient of a digital filter included in an equalization device configured to equalize a received sample value of a received signal with coherent reception by means of digital data processing, the filter coefficient update amount output device including: a first output unit that outputs a first coefficient update amount derived from a difference between a temporary determination result regarding a processed received sample value being the received sample value on which filter processing by the digital filter has been performed, and the processed received sample value; a second output unit that outputs a second coefficient update amount derived from a gradient with respect to the filter coefficient in such a way as to minimize a magnitude of a difference between statistical information of the processed received sample value for a given time width, and a set value for the statistical information; and a third output unit that outputs the coefficient update amount derived from the first coefficient update amount and the second coefficient update amount.

Advantageous Effects of Invention

The filter coefficient update amount output device and the like according to the present invention are able to suppress wrong convergence of a filter coefficient without reducing the data communication speed.

EXAMPLE EMBODIMENT

First Example Embodiment

Figure 1A:
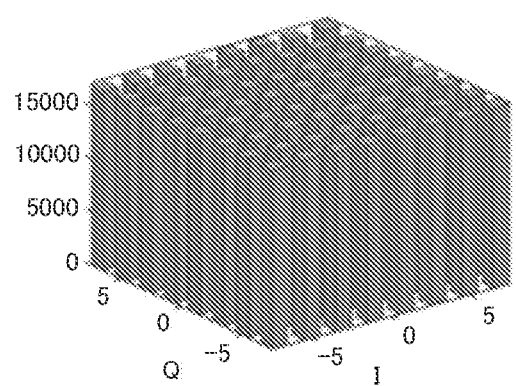
FIG. 1A is a diagram illustrating an example of a probability distribution of generation of 64QAM-based signal points of a PCS signal.
Figure 1B:
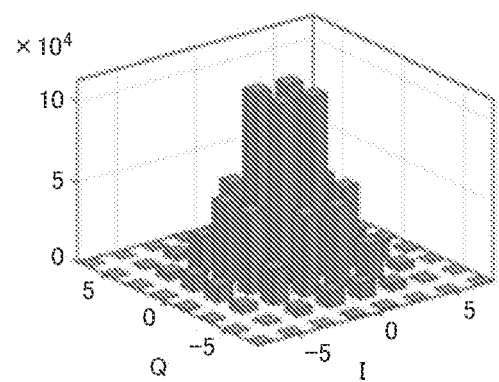
FIG. 1B is a diagram illustrating an example of a probability distribution of generation of 64QAM-based signal points of a PCS signal.

The first example embodiment relates to a coefficient update amount derivation method that may suppress a wrong convergence of a filter coefficient used for time-domain filter processing.

[Configuration and Operation]

The optical communication system according to the present example embodiment uses the one according to the present example embodiment described below in the coefficient update amount derivation process performed by the adaptive equalization unit 83 of the general optical communication system illustrated in FIGS. 1A to 5. The coefficient update amount derivation process is a process of deriving the coefficient update amount to be used for updating the filter coefficient $h_{ij}$ in the coefficient update 12 illustrated in FIG. 6.

In the coefficient update amount derivation process according to the present example embodiment, in order to derive statistical information of the received signal in a certain time width, blocking is performed to separate the received sample value by a predetermined time frame, and the filter coefficient $h_{ij}$ is updated by each block. The updating of the filter coefficient $h_{ij}$ by the blocked DDLMS is performed as the following expression:

$$h_{ij} \rightarrow h_{ij} - \alpha \sum_l \frac{\partial (\varepsilon_i^{DDLMS}[l])^2}{\partial h_{ij}} \quad \text{Expression 6}$$

where the second term on the right side of the expression 6 is a coefficient update amount $\Delta h_{ij}$. The following equation also holds.

$$\varepsilon_i^{DDLMS}[l] = d_i[l] - y_i[l]$$

The above equation is a difference between the temporary determination result derived for each symbol and a received symbol. l is an integer (symbol timing) representing discrete time.

The derivative of the second term of the right side of the expression 6 is calculated as follows.

$$h_{ij} \rightarrow h_{ij} + \mu \sum_l \varepsilon_i^{DDLMS}[l] x_j^*[l] \quad \text{Expression 7}$$

When the filter coefficient $h_{ij}$ is updated, based on the difference between the statistical information of the received signal and the desired value, by means of the stochastic gradient descent method in such a way as to minimize the difference, in addition to the DDLMS, the filter coefficient update is given as follows:

$$h_{ij} \rightarrow h_{ij} - \alpha \sum_l \frac{\partial (\varepsilon_i^{DDLMS}[l])^2}{\partial h_{ij}} - \alpha' \frac{\partial (\varepsilon_i^{stat})^2}{\partial h_{ij}} \quad \text{Expression 8}$$

where $\varepsilon_i^{stat}$ is a difference between the statistical information derived for the received symbol of the ith (i is 1 or 2) polarized wave of the block and the desired value determined from the transmitted PCS signal.

The statistical information may be anything that can distinguish PCS signals with different signal entropy. An example of simple statistical information is the average intensity, for example.

The statistical information itself on the transmitted PCS signal or a value obtained by adding, to the statistical information, a change that occurs on the transmission route is used as the desired value determined from the transmitted PCS signal, for example. The desired value is either shared in advance before communication by a sending side and a receiving side, or information is transmitted from the sending side upon communication via a communication route. The communication path may be the transmission route 120 illustrated in FIG. 2 or a transmission route other than the transmission rote 120.

Figure 9:
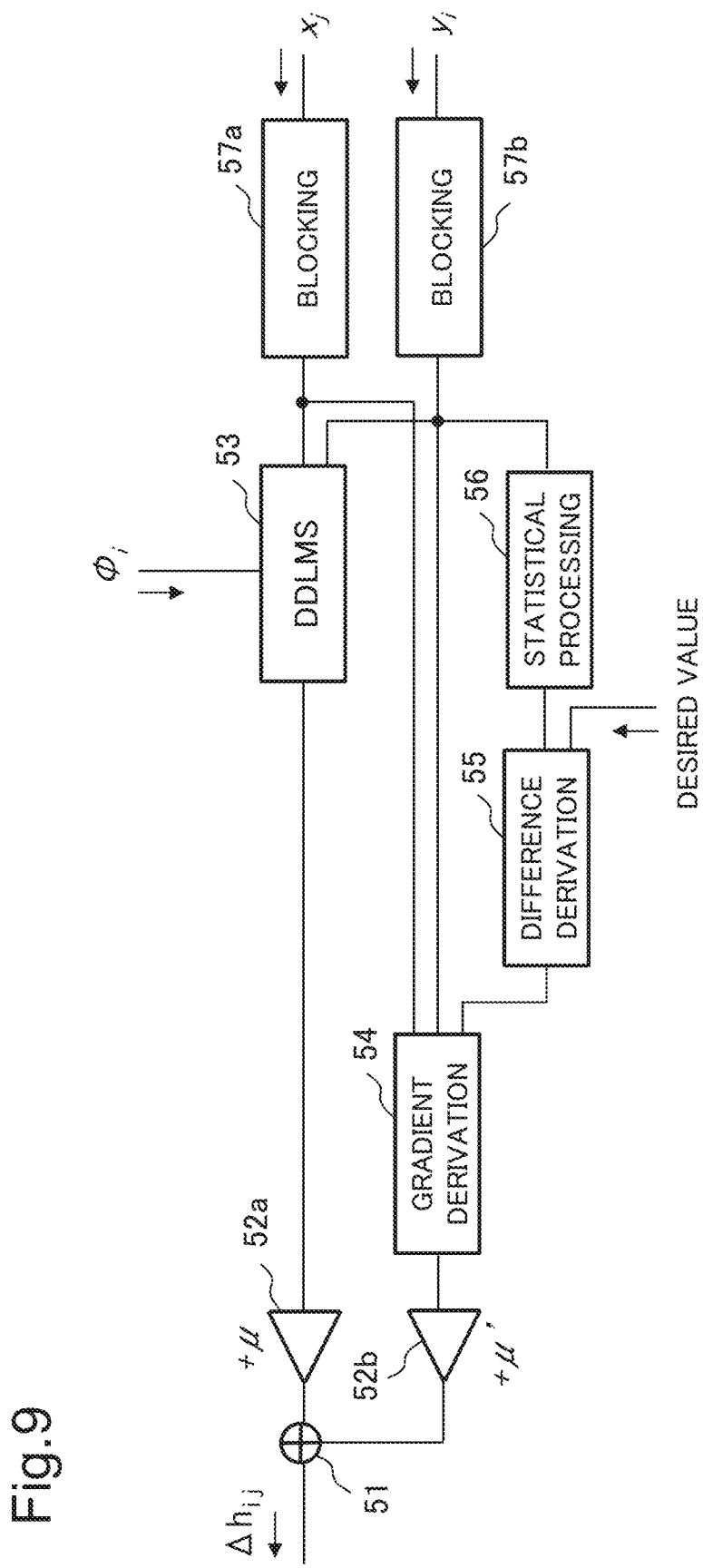
FIG. 9 is a block diagram illustrating exemplary coefficient update amount derivation process according to a first example embodiment.

FIG. 9 is a block diagram illustrating the above-described exemplary coefficient update amount derivation process. The received sample values $x_j$ and $y_i$ and the phase difference $\Phi_i$ according to the example embodiment are the same as the ones described with reference to FIG. 7.

Figure 5:
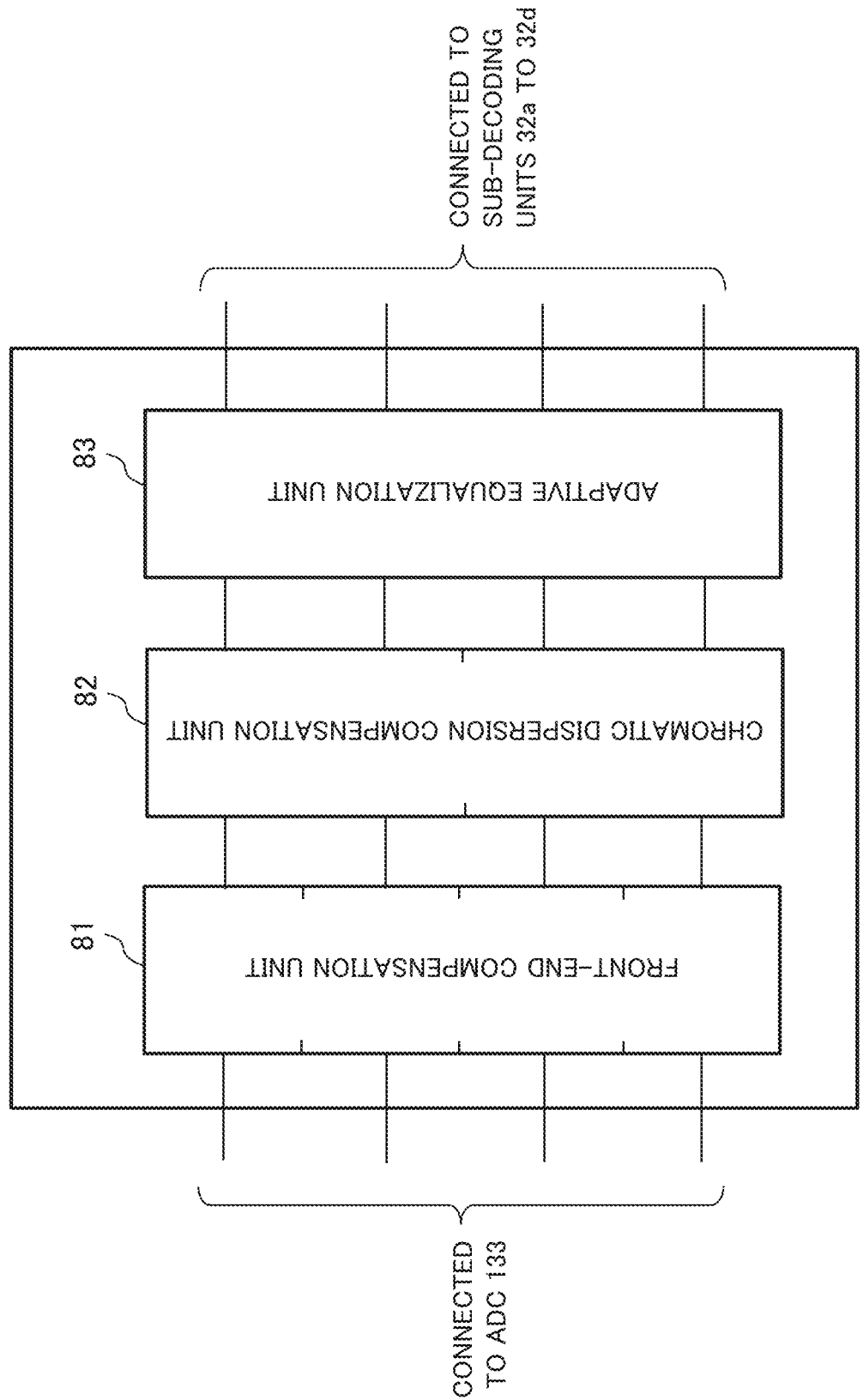
FIG. 5 is a conceptual diagram illustrating a configuration example of the demodulation unit.

The adaptive equalization unit 83 illustrated in FIG. 5 performs blocking 57a and 57b to the received sample values $x_j$ and $y_i$. The blocking 57a and 57b are processes of separating each of the received sample values $x_j$ and $y_i$ being the consecutive received sample values into blocks of a certain time width.

The adaptive equalization unit 83 calculates the coefficient update amount by the DDLMS as the DDLMS 53 from the received sample values $x_j$ and $y_i$ after the blocking 57a and the phase difference $\Phi_i$. The adaptive equalization unit 83 performs constant multiplication 52a by μ for the result by DDLMS 53.

Meanwhile, the adaptive equalization unit 83 performs statistical processing 56 for each block of the blocked received sample value $y_i$. The statistical processing 56 is a calculation of the average intensity of the received sample value $y_i$, for example.

The adaptive equalization unit 83 derives a difference of the result of the statistical processing 56 and the desired value. Herein, the desired value is a pre-assumed set value determined by the transmitted PCS signal or the like.

Then, the adaptive equalization unit 83 derives a gradient by gradient derivation 54 using the received sample value $x_j$ on which the blocking 57a is performed, the received sample value $y_i$ on which the blocking 57b is performed, and the difference by difference derivation 55.

The adaptive equalization unit 83 performs constant multiplication 52b by μ' for the result of the gradient derivation 54.

The adaptive equalization unit 83 performs an addition of the value after constant multiplication 52a and the value after the constant multiplication 52b as the addition 51 and outputs the value after the addition 51 as the coefficient update amount $\Delta h_{ij}$.

Figure 10:
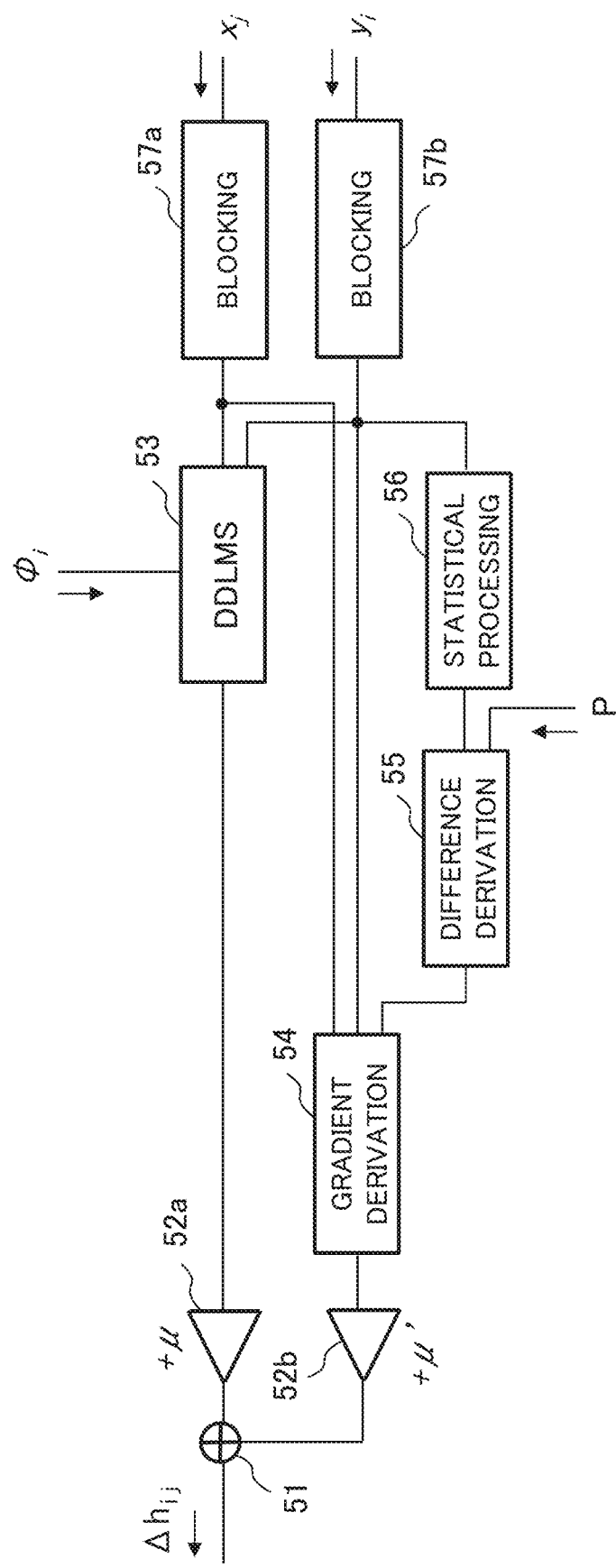
FIG. 10 is a block diagram illustrating an exemplary coefficient update process using average intensity of received symbols.

FIG. 10 is a block diagram illustrating a coefficient update process using the average intensity of received symbols as the statistical information. In FIG. 10, average intensity P of the transmitted PCS signal is used as the desired value illustrated in FIG. 9.

In this case, the difference between the statistical information derived for the received symbol by the statistical processing 56 and the desired value determined from the transmitted PCS signal is expressed by the following equation.

$$\varepsilon_i^{stat} = \varepsilon_i^P = P - \langle |y_i[l]|^2 \rangle = P - \frac{1}{L}\sum_l |y_i[l]|^2 \quad \text{Equation 9}$$

In order to minimize the above amount, the filter coefficient $h_{ij}$ is controlled by means of the stochastic gradient descent method using the square of this value as the cost. After calculating the derivative with respect to the filter coefficient $h_{ij}$, the second term of the expression 8 is expressed by the following expression.

$$\mu' \varepsilon_i^P \sum_l y_i[l] x_j^*[l] \quad \text{Expression 10}$$

Substituting expressions 7 and 10 into expression 8, the coefficient update amount $\Delta h_{ij}$ of the filter coefficient $h_{ij}$ in the case the average intensity of the block of the received symbol is used as the statistical information is derived.

Figure 11:
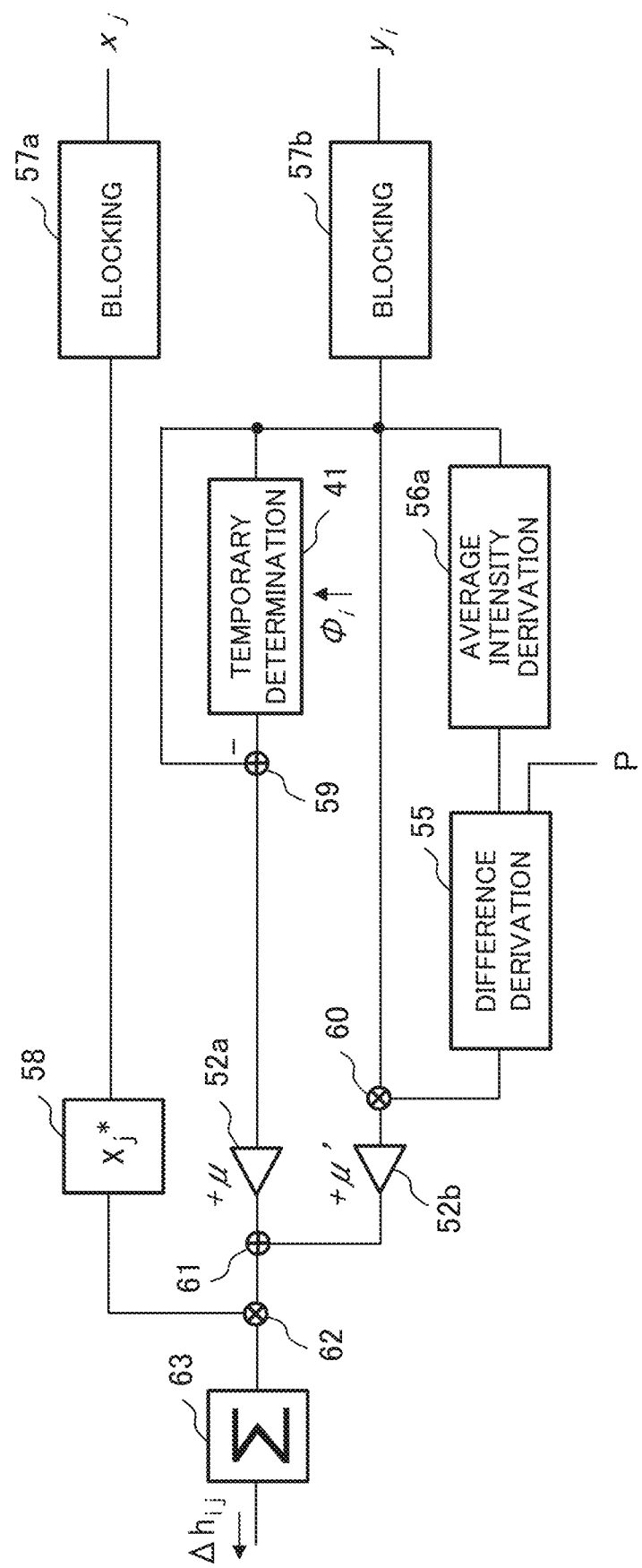
FIG. 11 is a block diagram illustrating an exemplary coefficient update process using the average intensity of received symbols.

The block diagram of the above-described process is illustrated in FIG. 11.

The blocking 57a and 57b, the constant multiplication 52a and 52b, and the difference derivation 55 represented in FIG. 11 are the same as the ones illustrated in FIG. 10. The temporary determination 41 is the same as the one illustrated in FIG. 7. Subtraction 59 is a subtraction of the received sample value $y_i$ from the received sample value $y_i$ after the temporary determination 41. Addition 61 is an addition of the input values. Each of multiplication 60 and 62 is a multiplication of the input values.

Average magnitude derivation 56a is a derivation of the average intensity for each block of the blocked received sample value $y_i$. Complex conjugation 58 is a process of deriving a complex conjugate of the expression 10 using the received sample value $x_j$. $\Sigma 63$ is a process of calculating a total sum in the expression 10.

A control by means of Constant Modulus Algorithm or the like may be performed as a preliminary convergence of the filter coefficient control by the DDLMS, however, a value calculated from the average intensity P of the PCS signal can be used as the reference amplitude.

The probability density of the received symbol can be used as the statistical information. In this case, PCS signals having different signal entropy can be distinguished with higher accuracy, and a possibility of a wrong convergence of the coefficient update amount $\Delta h_{ij}$ can be reduced. In this case, the probability density of the PCS signal is used as the desired value. In order to bring the probability density of the received symbol closer to the desired probability density, the probability density of the received sample value $y_i$ after the FIRF processing is derived in a manner that is differentiable with respect to the filter coefficient $h_{ij}$. The filter coefficient $h_{ij}$ is updated by means of the stochastic gradient descent method in such a way as to minimize the difference between the probability density of the received symbol and the desired probability density.

In this case, the adaptive equalization unit 83 illustrated in FIG. 5 derives the probability density of the blocked received symbol, compares it with the desired probability density, and calculates the difference, $$\varepsilon_i^{stat} = \varepsilon_i^{PDF} \quad \text{Equation 11}$$

and derives the coefficient update amount $\Delta h_{ij}$ used for updating the filter coefficient $h_{ij}$ from a gradient of the square of the difference with respect to the filter coefficient $h_{ij}$. When the probability density of the received symbol is defined as $Qy_i(y)$ and the desired probability density is defined as $Pr(y)$, the difference of these can be acquired by several methods such as the Kullback-Leibler divergence and the $L_2$ norm. Herein, using the $L_2$ norm, the difference is expressed as in the following equation:

$$\varepsilon_i^{PDF} = L_2(Q_y; Pr) = \sum_{y \in Y} |Q_{y_i}(y) - Pr(y)|^2 \quad \text{Equation 12}$$

where the probability density $Pr(y)$ of the desired transmitted PCS signal is expressed as follows.

$$Pr(y) = \frac{1}{Z} e^{-\lambda |y|^2} \quad \text{Equation 13}$$
$$Z = \sum_{y \in Y} e^{-\lambda |y|^2}$$

When the probability density of the received symbol $Qy_i(y)$ is expressed as follows, $$Q_{y_i}(y) = \quad \text{Equation 14}$$
$$\frac{1}{(nL)^2} \sum_l K\left(\frac{\text{Re}[y] - \text{Re}[y_i[l]]}{h}\right) K\left(\frac{\text{Im}[y] - \text{Im}[y_i[l]]}{h}\right)$$

the gradient with respect to the filter coefficient $h_{ij}$ can be calculated by means of kernel density estimation. Herein, the following equation holds.

$$K(\xi) = \frac{1}{\sqrt{2\pi}} e^{-\frac{\xi^2}{2}} \quad \text{Equation 15}$$

The following equation also holds.

$$Q_{y_i}(y) = \frac{1}{(nh)^2} \sum_l \exp\left(-\frac{1}{2}\left|\frac{y - y_i[l]}{h}\right|^2\right) \quad \text{Equation 16}$$

When the probability density $Qy_i(y)$ of the received symbol is used as the statistical information, the second term of the expression 8 is expressed as follows.

$$\mu' \sum_{y \in Y} (Q_{y_i}(y) - \quad \text{Expression 17}$$
$$Pr(y)) \sum_l \exp\left(-\frac{1}{2}\left|\frac{y - y_i[l]}{h}\right|^2\right)(y_i[l] - y)x_j^*[l]$$

Figure 12:
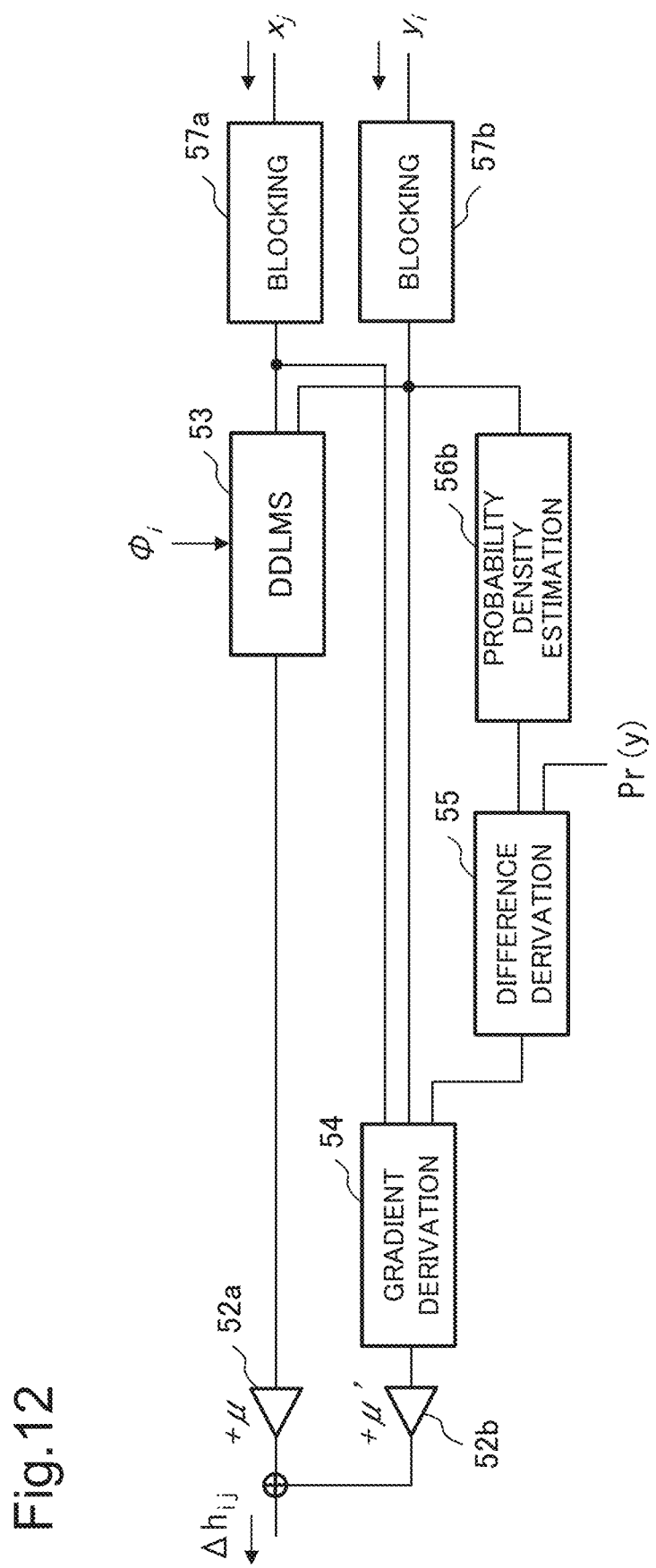
FIG. 12 is a block diagram illustrating an exemplary coefficient update amount derivation process in a case of using a probability density of received symbols.

FIG. 12 is a block diagram illustrating a coefficient update amount derivation process in a case of using a probability density of received symbols for each block as the statistical information. The coefficient update amount derivation process is a process of deriving the coefficient update amount when the update process unit 45 illustrated in FIG. 7 updates the filter coefficient $h_{ij}$.

The blocking 57a and 57b, the DDLMS 53, the gradient derivation 54, and the constant multiplication 52a and 52b illustrated in FIG. 12, are the same as the ones illustrated in FIG. 9.

The adaptive equalization unit 83 illustrated in FIG. 5 performs probability density estimation 56b for estimating the probability density $Qy_i(y)$ of the received symbol in each block as the statistical processing 56 illustrated in FIG. 9.

The adaptive equalization unit 83 derives the difference between the probability density $Qy_i(y)$ of the received symbol in each block and the desired probability density $Pr(y)$ as the difference derivation 55.

The other process performed by the adaptive equalization unit 83 is similar to the process illustrated in FIG. 9.

[Effect]

The coefficient update amount derivation method of the filter coefficient of FIRF according to the present example embodiment is based on the general coefficient update amount derivation by the DDLMS, taking into consideration the difference between the statistical information regarding the output from the FIRF and the desired value. Therefore, the coefficient update amount derivation method enables the filter coefficient to be updated in such a way that the statistical information is less likely to deviate from the desired value. Therefore, the coefficient update amount derivation method may suppress the wrong convergence of the filter coefficient of the FIRF in such a way that the difference widens.

Moreover, the derivation method of the coefficient update amount does not require a periodical insertion of a training pattern to the transmission data as described in the Technical Problem section. Therefore, the derivation method of the coefficient update amount may suppress a wrong convergence of a filter coefficient without decreasing the data communication speed.

Second Example Embodiment

The second example embodiment relates to a coefficient update amount derivation method that may suppress a wrong convergence of a filter coefficient in a case a frequency-domain filter is used for an adaptive equalization using a PCS signal.

[Configuration and Operation]

Figure 6:
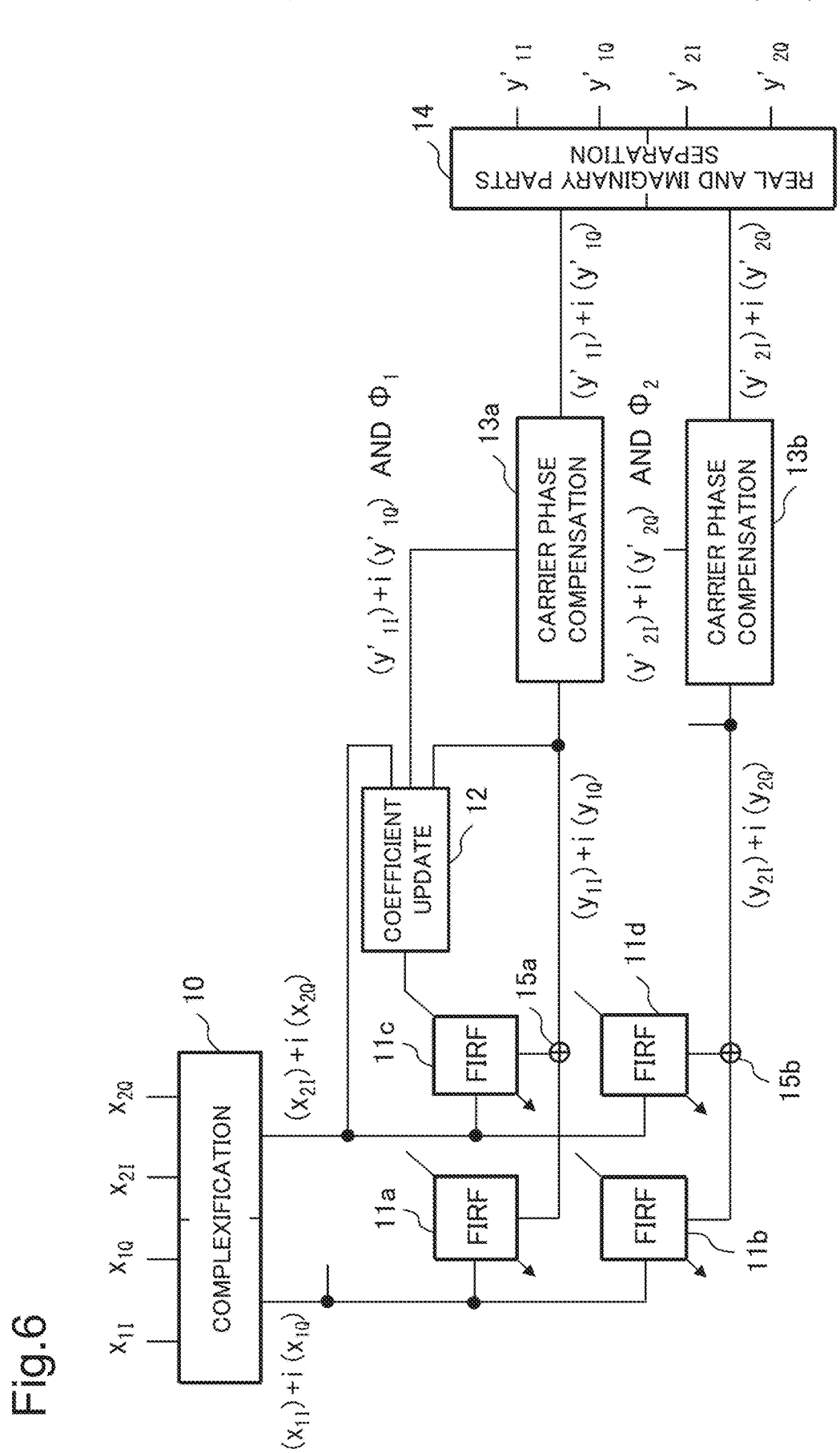
FIG. 6 is a block diagram illustrating an exemplary adaptive equalization process.
Figure 13:
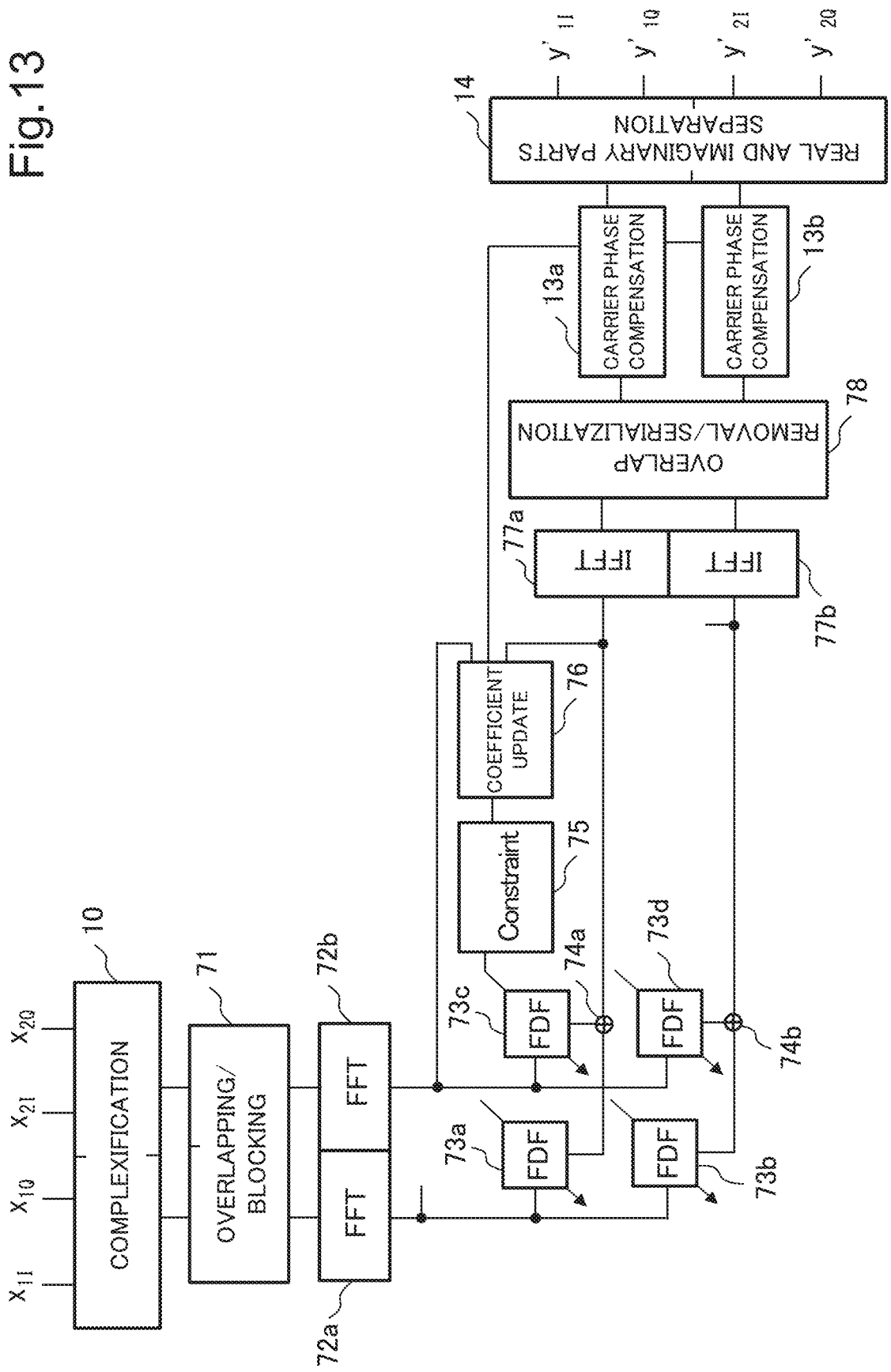
FIG. 13 is a block diagram illustrating an exemplary adaptive equalization process according to a second example embodiment.

In the present example embodiment, a frequency-domain filter processing is used instead of FIRF 11a to 11d being time-domain filters illustrated in FIG. 6. FIG. 13 is a block diagram illustrating exemplary adaptive equalization processing according to the present example embodiment performed by the adaptive equalization unit 83 illustrated in FIG. 5.

The received sample values $x_{1I}$, $x_{1Q}$, $x_{2I}$, and $x_{2Q}$, and the complexification 10 are the same as the ones illustrated in FIG. 6.

The adaptive equalization unit 83 illustrated in FIG. 5 performs overlapping/blocking 71 for each of the complex numbers $(x_{1I})+i(x_{1Q})$ and $(x_{2I})+i(x_{2Q})$ generated by the complexification 10. The overlapping/blocking 71 is the blocking of the received sample value per predetermined time width by means of an overlap method. In the process, the received sample value is aperiodic, while the Fast Fourier Transform (FFT) performed in the next step is assumed to have a periodic signal.

The adaptive equalization unit 83 performs the FFT to the blocked received sample values $(x_{1I})+i(x_{1Q})$ and $(x_{2I})+i(x_{2Q})$ as the FFT 72a and 72b.

The adaptive equalization unit 83 performs 2×2 filter processing of the FDF 73a to 73d to the received sample values after the FFT. Herein, FDF stands for Frequency Digital Domain Filter, which is a frequency-domain filter.

The adaptive equalization unit 83 adds an output of the FDF 73a and an output of the FDF 73c as addition 74a. The adaptive equalization unit 83 also adds an output of the FDF 73b and an output of the FDF 73d as addition 74b.

The adaptive equalization unit 83 converts, as IFFT 77a and 77b, the received sample values after the addition 74a and 74b to the received sample values in the time domain by means of IFFT. Herein, IFFT stands for Inverse Fast Fourier Transform.

The adaptive equalization unit 83 removes, as the overlap removal/serialization 78, an overlap performed by the overlapping/blocking 71 from each of the received sample values after the IFFT.

The adaptive equalization unit 83 performs the carrier phase compensation 13a and 13b to each of the received sample values after overlap removal. The carrier phase compensation 13a and 13b are similar to the ones in FIG. 6.

As the real and imaginary parts separation 14, the adaptive equalization unit 83 separates the real and imaginary parts of each of the received sample values after carrier phase compensation and outputs 4 series of received sample values $y'_{1I}$, $y'_{1Q}$, $y'_{2I}$, and $y'_{2Q}$.

Meanwhile, as coefficient update 76, the adaptive equalization unit 83 updates the filter coefficient used for each FDF, in parallel with the above-described process. The adaptive equalization unit 83 performs the update using each received sample value before filter processing, each received sample value after filter processing, and the phase difference $\Phi_i$ acquired during the carrier phase compensation 13a and 13b.

The updating of the filter coefficient is performed by an adaptive equalization algorithm, as in the case of the time-domain filter (FIRF) according to the first example embodiment.

The adaptive equalization unit 83 performs a Constraint 75 to the coefficient update amount. The Constraint is a process of converting the filter coefficient used for updating to the time domain, replacing the part where the impulse response coincides with the overlap part with 0 and converting it back to the frequency domain. The Constraint is performed to avoid the fact that a distortion of the wrap-around caused by assuming a periodic signal in the FFT remains, when a time width of a time-domain impulse response of a frequency-domain filter does not fall within an overlapping amount.

Figure 14:
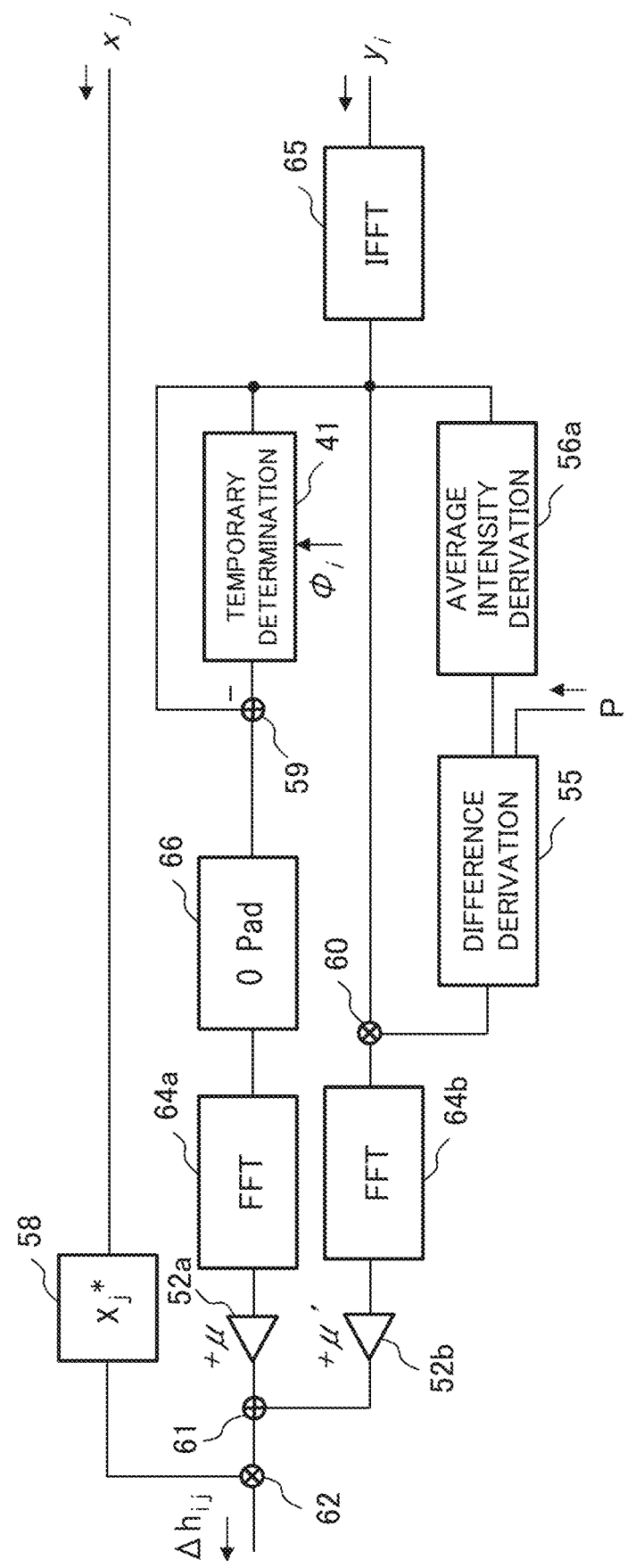
FIG. 14 is a block diagram illustrating exemplary filter coefficient update amount derivation process according to the second example embodiment.

FIG. 14 is a block diagram illustrating a filter coefficient update amount derivation process when the average intensity of a block of the received symbol is used as the statistical information in the coefficient update 76 illustrated in FIG. 13.

As illustrated in FIG. 13, when an FDF being a frequency-domain filter processing is performed, the adaptive equalization unit 83 derives the coefficient update amount from the received sample values in the frequency domain before filter processing and the received sample values in the frequency domain after filter processing. In this case, since the blocking is already performed during the conversion of the received sample values to the frequency domain by the FFT, the blocking is not necessary to be performed to the received sample values $x_j$ and $y_i$ as illustrated in FIG. 11.

The adaptive equalization unit 83 performs the temporary determination 41 to the received sample value $y_i$ after the IFFT using the phase difference $\Phi_i$. Then, as the subtraction 59, the adaptive equalization unit 83 subtracts the received sample value $y_i$ from the temporary determination result.

The adaptive equalization unit 83 performs an OPad processing to return the received sample value after subtraction 59 to a twice oversampled state, as an OPad processing 66. The adaptive equalization unit 83 performs the FFT to received sample values after the OPad 66 as an FFT 64a. The adaptive equalization unit 83 multiplies the received sample value after the FFT by a constant μ, as the constant multiplication 52a.

Meanwhile, the adaptive equalization unit 83 derives the average intensity for each block of the received sample value $y_i$ after the IFFT, as the average intensity derivation 56a. The adaptive equalization unit 83 derives a difference between the average intensity of the received sample value $y_i$ after the IFFT and the average intensity P of the transmitted PCS signal, as the difference derivation 55.

Then, as the multiplication 60, the adaptive equalization unit 83 multiplies the received sample value $y_i$ after the IFFT 65 by the difference calculated by the difference derivation 55. The adaptive equalization unit 83 performs the FFT to received sample values after the multiplication 60 as an FFT 64b. The adaptive equalization unit 83 multiplies the received sample values after the FFT 64b by μ', as the constant multiplication 52b.

The adaptive equalization unit 83 adds the received sample value after constant multiplication 52a and the received sample value after constant multiplication 52b, as the addition 61.

The adaptive equalization unit 83 multiplies the received sample value after the complex conjugation 58 by the received sample value after addition 61, as the multiplication 62, and outputs as the coefficient update amount.

Figure 15:
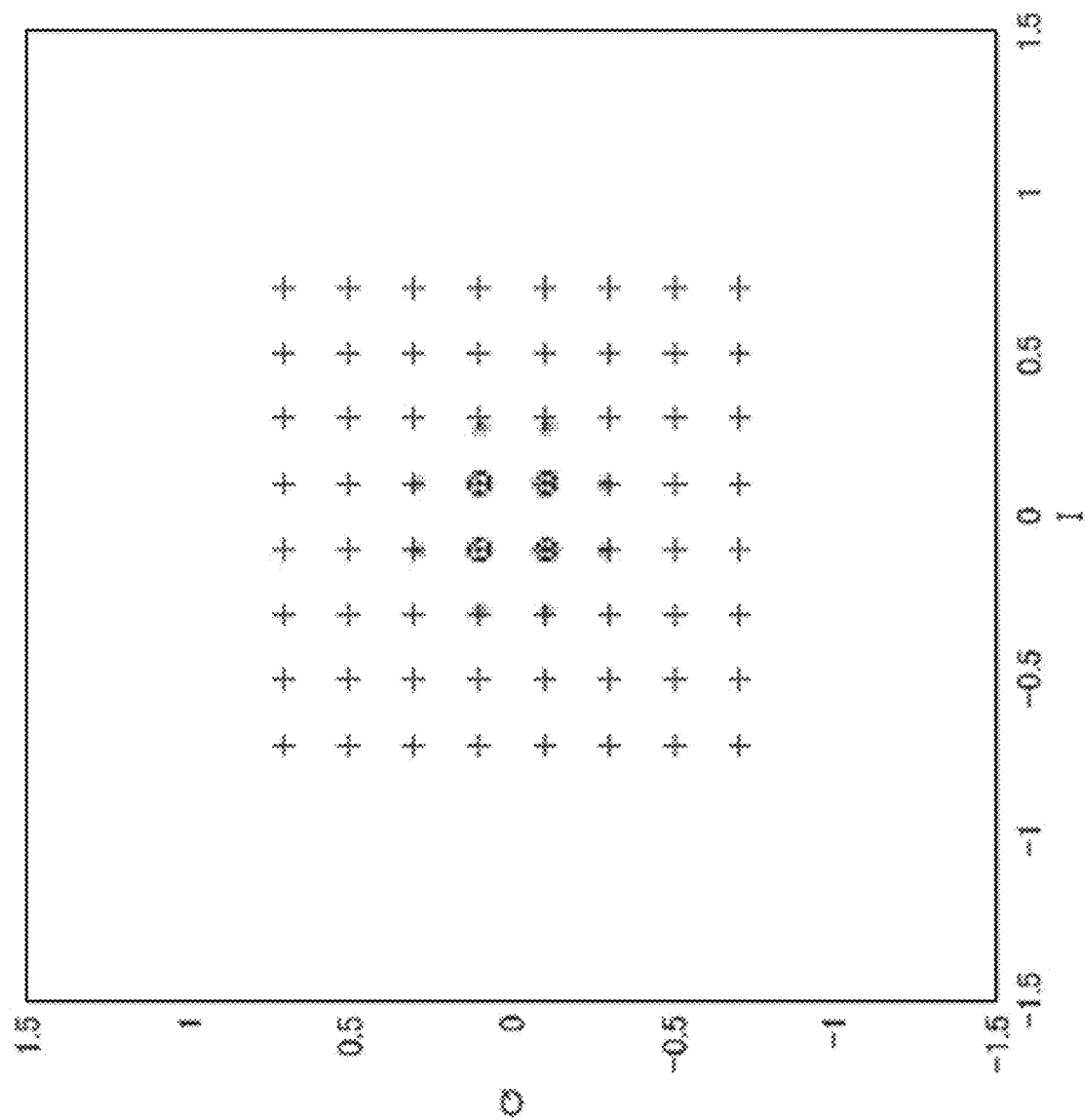
FIG. 15 is a diagram illustrating an exemplary result of constellation when the filter coefficient is updated using the coefficient update amount derivation method according to the second example embodiment.

FIG. 15 is a diagram illustrating a constellation of an experiment result of updating the filter coefficient using the coefficient update amount derivation method according to the present example embodiment. A condition in which a wrong convergence of the filter occurred is used in an adaptive equalization by means of the ordinary DDLMS as the constellation illustrated in FIG. 7. In FIG. 15, a frequency-domain filter is used as the filter, and the average intensity of the received symbol is used as the statistical information. FIG. 15 is a constellation of the received symbol after a carrier phase compensation of the first polarized wave (X polarized wave).

Figure 1C:
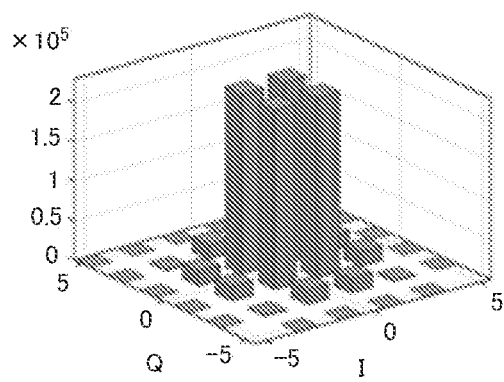
FIG. 1C is a diagram illustrating an example of a probability distribution of generation of 64QAM-based signal points of a PCS signal.
Figure 2:
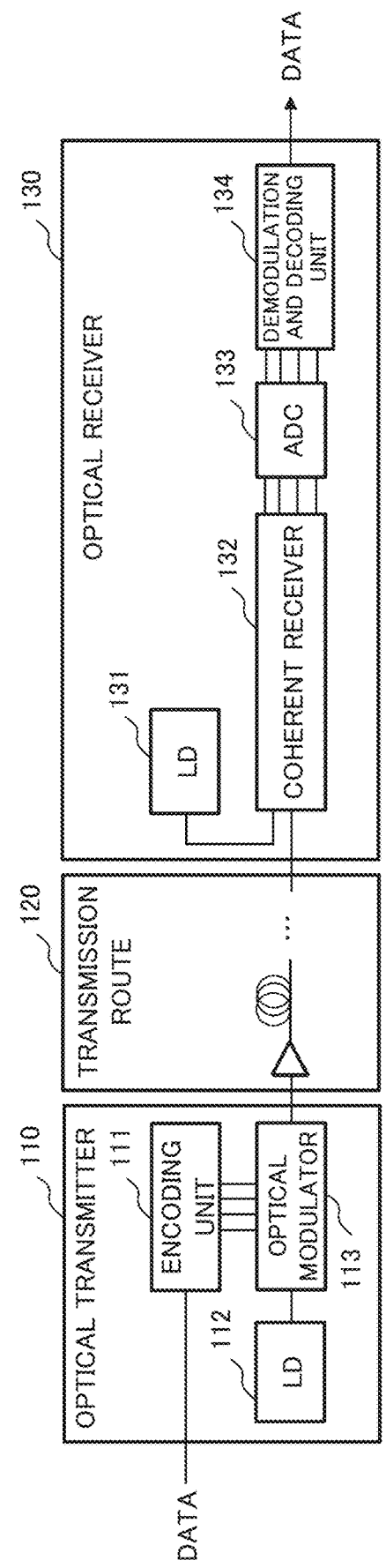
FIG. 2 is a conceptual diagram illustrating a configuration example of a general optical communication system using the PCS signal.
Figure 3:
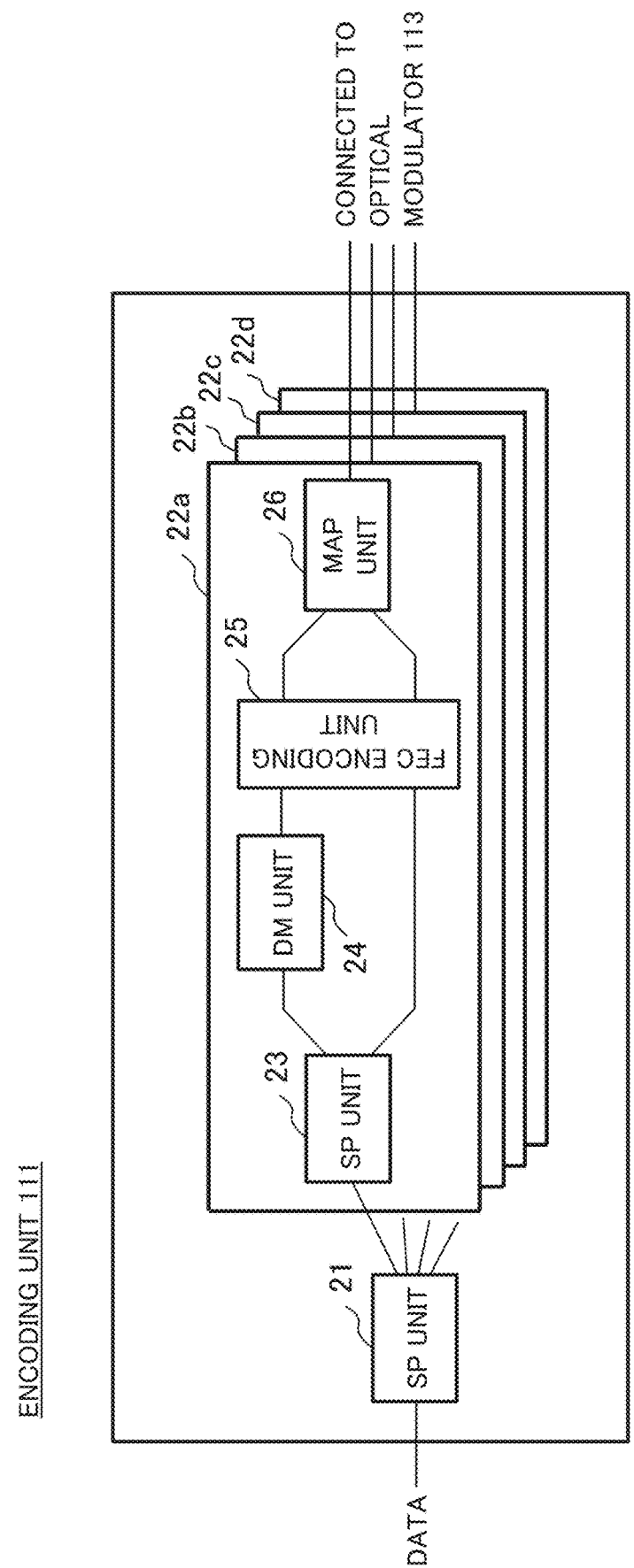
FIG. 3 is a conceptual diagram illustrating a configuration example of the encoding unit.
Figure 4:
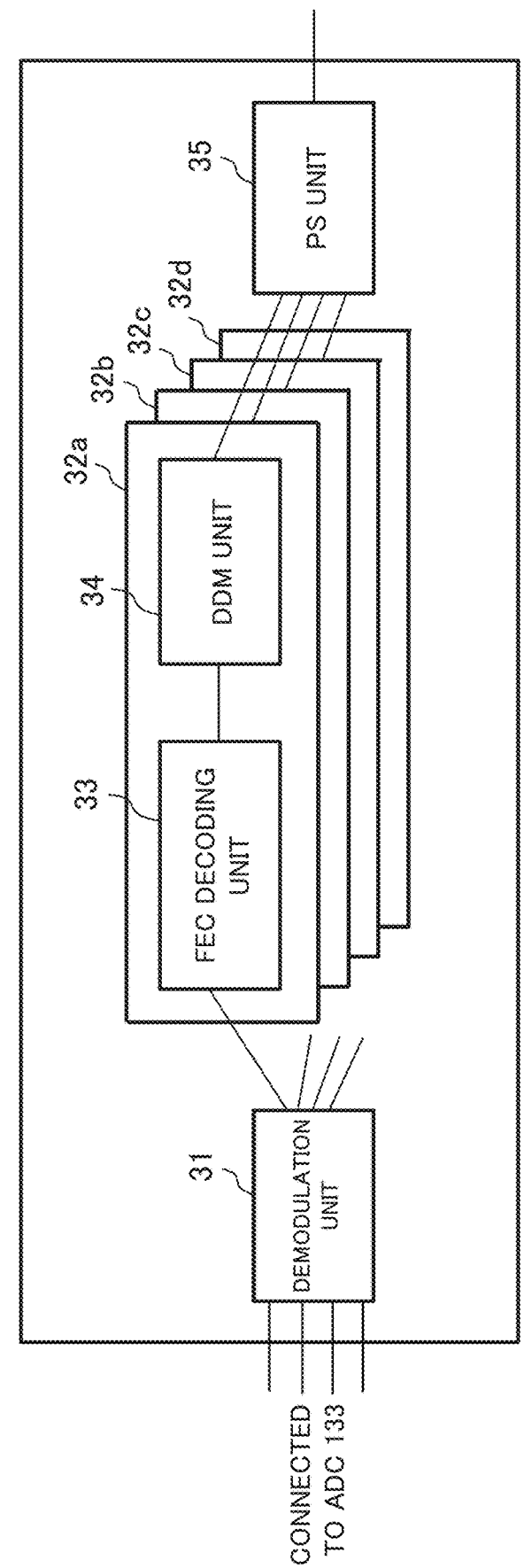
FIG. 4 is a conceptual diagram illustrating a configuration example of the demodulation and decoding unit.
Figure 7:
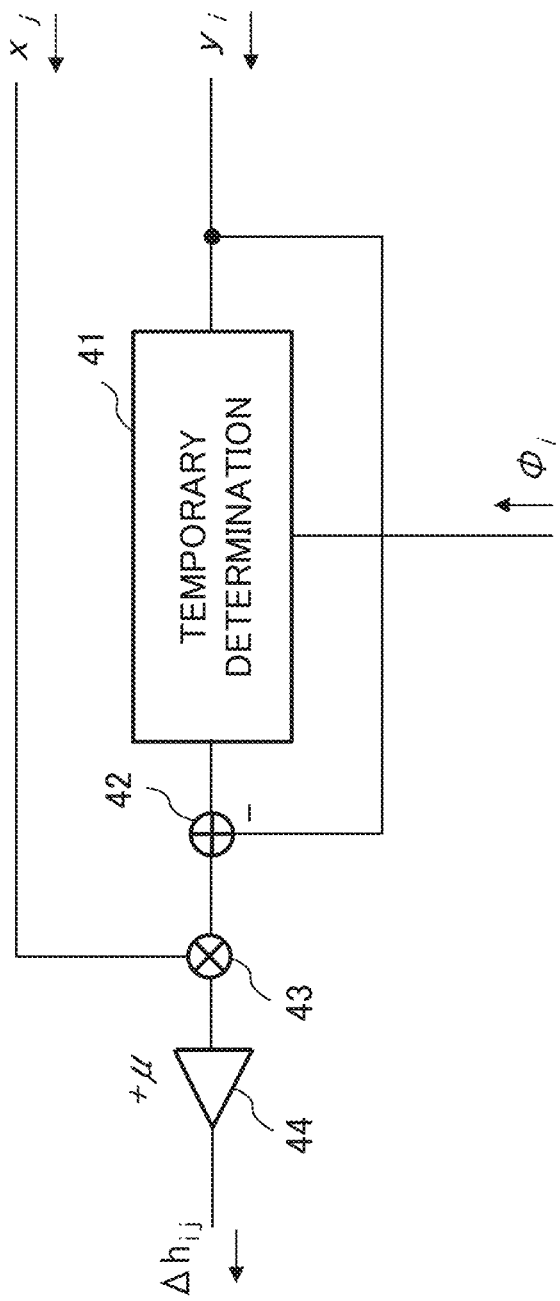
FIG. 7 is a block diagram illustrating an exemplary process of coefficient update amount derivation.
Figure 8:
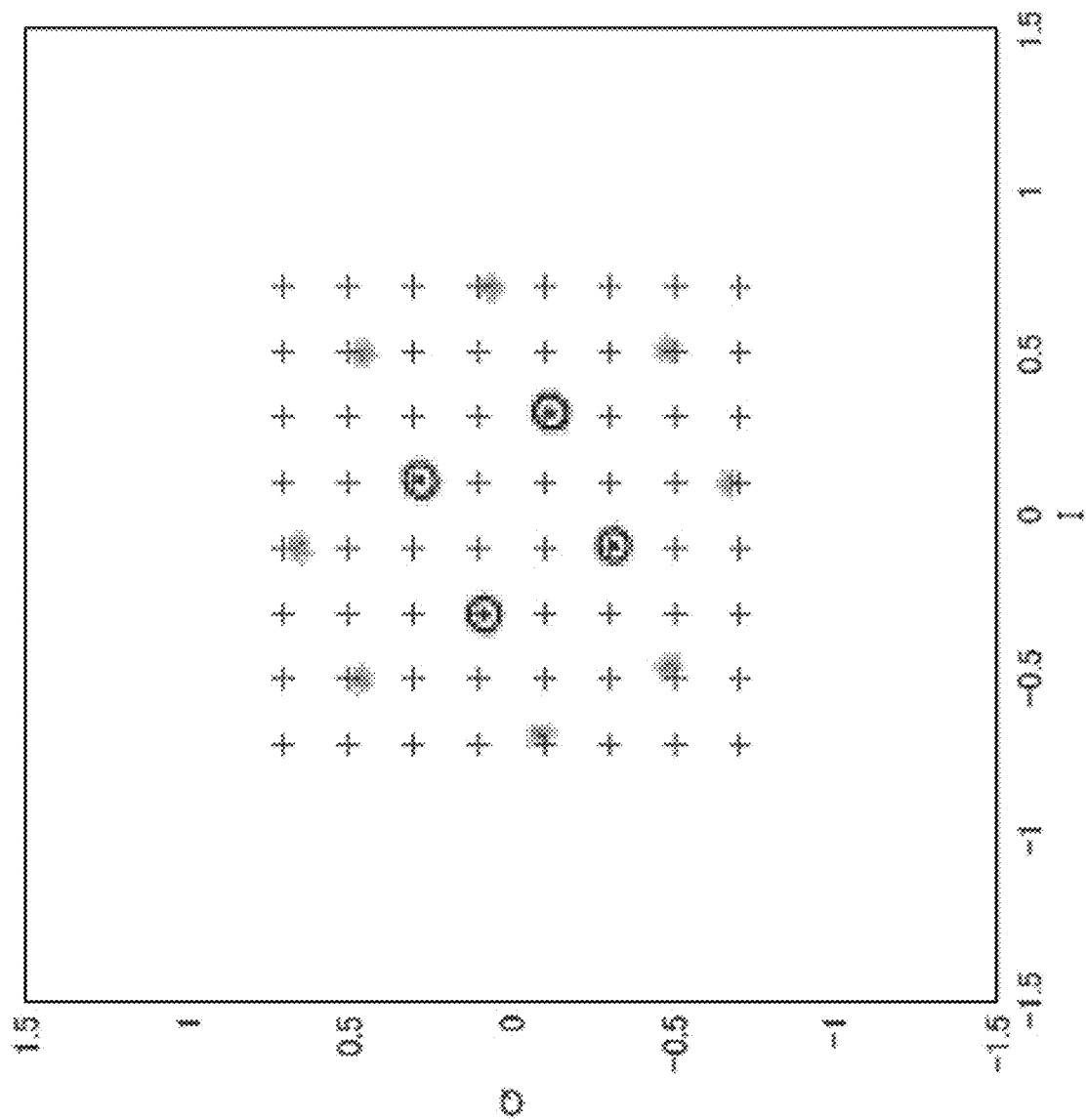
FIG. 8 is a constellation diagram illustrating a failure case of blind adaptive equalization.

In the constellation illustrated in FIG. 15, the probability density is similar to that in FIG. 1C, and the problem of a wrong convergence of the filter coefficient as illustrated in FIG. 7 has been resolved.

[Effect]

The coefficient update amount derivation method according to the present example embodiment may suppress a wrong convergence of the filter coefficient when a frequency-domain filter is used as the filter for adaptive equalization.

Moreover, the derivation method of the coefficient update amount does not require a periodical insertion of a training pattern to the transmission data. Therefore, the derivation method of the coefficient update amount may suppress a wrong convergence of a filter coefficient without reducing the data communication speed.

Figure 16:
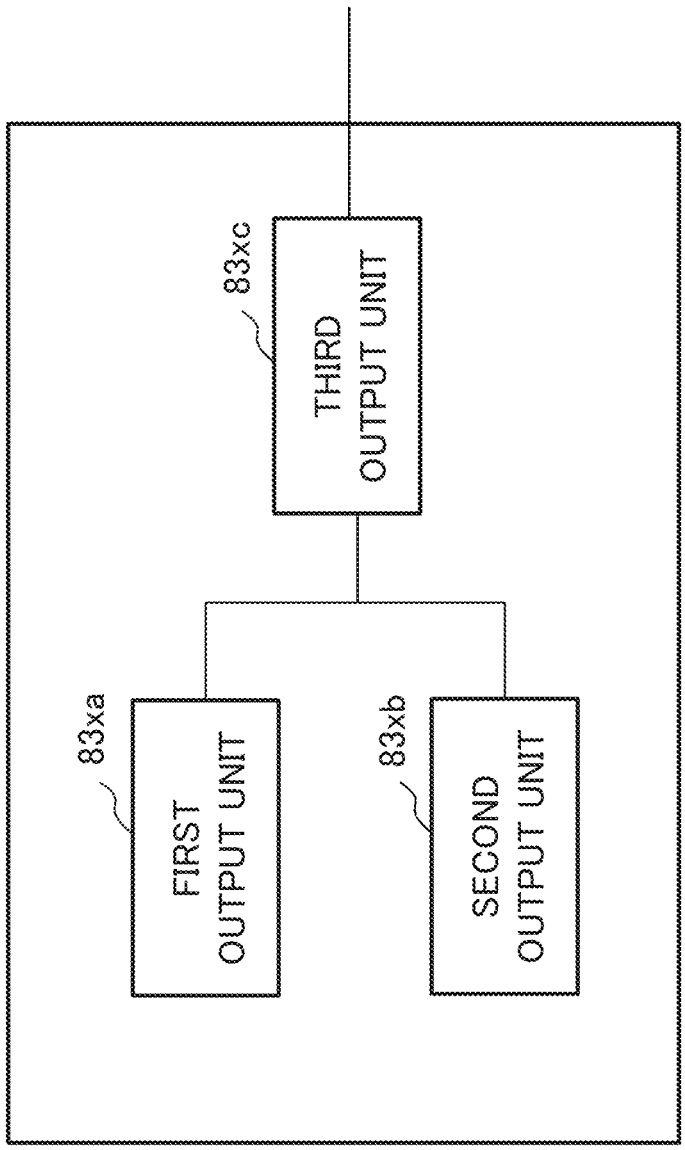
FIG. 16 is a block diagram illustrating a minimum configuration of a filter coefficient update amount output device according to the example embodiments.

FIG. 16 is a block diagram illustrating the filter coefficient update amount output device 83x being a minimum configuration of a filter coefficient update amount output device according to the example embodiments.

The filter coefficient update amount output device 83x is a filter coefficient update amount output device for outputting a filter coefficient update amount. The coefficient update amount is a value for updating a filter coefficient of a digital filter included in an equalization device configured to equalize a received sample value of a received signal received with coherent reception by means of digital data processing.

The filter coefficient update amount output device 83x includes a first output unit 83xa, a second output unit 83xb, and a third output unit 83xc.

The first output unit 83xa outputs a first coefficient update amount derived from a gradient with respect to the filter coefficient in such a way as to minimize the difference between a temporary determination result regarding a processed received sample value being the received sample value on which filter processing by the digital filter has been performed and the processed received sample value.

The second output unit 83xb outputs a second coefficient update amount derived from a gradient with respect to the filter coefficient in such a way as to minimize a magnitude of a difference between statistical information of the processed received sample value for a given time width and a set value for the statistical information.

The third output unit 83xc outputs the coefficient update amount derived from the first coefficient update amount and the second coefficient update amount.

The filter coefficient update amount output device 83x derives using a gradient with respect to the filter coefficient in such a way as to minimize the difference between the statistical information and the set value. Therefore, the filter coefficient update amount output device 83x may suppress an update of the filter coefficient in such a way that the processed received sample value deviates from the set value.

Moreover, the filter coefficient update amount output device 83x does not require a periodical insertion of a training pattern to the transmission data. As a result, the filter coefficient update amount output device 83x may suppress a wrong convergence of a filter coefficient without reducing the data communication speed.

Thus, the filter coefficient update amount output device 83x has the effect described in the Advantageous Effects of Invention section, due to the above-described configuration.

While the invention has been particularly shown and described with reference to exemplary embodiments thereof, the invention is not limited to these embodiments, and various changes in form and details may be made therein without departing from the spirit and scope of the present invention as defined by the claims. For example, the configuration of an element illustrated in each diagram is merely an example for helping to understand the invention and is not limited to the configuration illustrated in the diagrams.

The whole or part of the example embodiments disclosed above can be described as, but not limited to, the following supplementary notes.

(Supplementary Note 1)

A filter coefficient update amount output device configured to output a coefficient update amount being a value for updating a filter coefficient of a digital filter included in an equalization device configured to equalize a received sample value of a received signal received with coherent reception by means of digital data processing, the filter coefficient update amount output device including:

a first output unit that outputs a first coefficient update amount derived from a difference between a temporary determination result concerning a processed received sample value being the received sample value on which filter processing by the digital filter has been performed and the processed received sample value;

a second output unit that outputs a second coefficient update amount derived from a gradient with respect to the filter coefficient in such a way as to minimize a magnitude of a difference between statistical information of the processed received sample value for a given time width and a set value for the statistical information; and a third output unit that outputs the coefficient update amount derived from the first coefficient update amount and the second coefficient update amount.

(Supplementary Note 2)

The filter coefficient update amount output device according to Supplementary Note 1, wherein the set value is a desired value being an expected value for the statistical information.

(Supplementary Note 3)

The filter coefficient update amount output device according to Supplementary Note 1 or 2, wherein the set value is based on a transmitted Probabilistic Constellation Shaping signal.

(Supplementary Note 4)

The filter coefficient update amount output device according to any one of Supplementary Notes 1 to 3, wherein the statistical information is average intensity of a received symbol related to the blocked received sample value after processing.

(Supplementary Note 5)

The filter coefficient update amount output device according to any one of Supplementary Notes 1 to 3, wherein the statistical information is probability density derived from kernel density estimation of a blocked received symbol.

(Supplementary Note 6)

The filter coefficient update amount output device according to any one of Supplementary Notes 1 to 5, wherein the digital filter performs time-domain filter processing.

(Supplementary Note 7)

The filter coefficient update amount output device according to any one of Supplementary Notes 1 to 5, wherein the digital filter performs frequency-domain filter processing.

(Supplementary Note 8)

A filter coefficient update device configured to update the filter coefficient by means of the filter coefficient update amount output device according to any one of Supplementary Notes 1 to 7.

(Supplementary Note 9)

An equalization device including the filter coefficient update device according to Supplementary Note 8 and the digital filter.

(Supplementary Note 10)

A receiving device including the equalization device according to Supplementary Note 9.

(Supplementary Note 11)

A communication system including the receiving device according to Supplementary Note 10.

(Supplementary Note 12)

A filter coefficient update amount output method of outputting a coefficient update amount being a value for updating a filter coefficient of a digital filter included in an equalization device configured to equalize a received sample value of a received signal received with coherent reception by means of digital data processing, the filter coefficient update amount output method including:

performing first output for outputting a first coefficient update amount derived from a difference between a temporary determination result concerning a processed received sample value being the received sample value on which filter processing by the digital filter has been performed, and the processed received sample value;

performing second output for outputting a second coefficient update amount derived from a gradient with respect to the filter coefficient in such a way as to minimize a magnitude of a difference between statistical information of the processed received sample value for a given time width, and a set value for the statistical information; and performing third output for outputting the coefficient update amount derived from the first coefficient update amount and the second coefficient update amount.

(Supplementary Note 13)

A filter coefficient update amount output program causing a computer to perform filter coefficient update amount output for outputting a coefficient update amount being a value for updating a filter coefficient of a digital filter included in an equalization device configured to equalize a received sample value of a received signal received with coherent reception by means of digital data processing, the program causing the computer to perform:

processing of performing first output for outputting a first coefficient update amount derived from a difference between a temporary determination result concerning a processed received sample value being the received sample value on which filter processing by the digital filter has been performed, and the processed received sample value;

processing of performing second output for outputting a second coefficient update amount derived from a gradient with respect to the filter coefficient in such a way as to minimize a magnitude of a difference between statistical information of the processed received sample value for a given time width, and a set value for the statistical information; and processing of performing third output for outputting the coefficient update amount derived from the first coefficient update amount and the second coefficient update amount.

The following is a description of correspondence between the terms used in the supplementary notes and the terms used before the supplementary notes.

The received sample value in Supplementary Note 1 is the received sample value $x_j$ illustrated in FIG. 9, 10, 11, 12, or 14, or the received sample value $x_{1I}$, $x_{1Q}$, $x_{2I}$, or $x_{2Q}$ illustrated in FIG. 13, for example. The equalization device is the adaptive equalization unit 83 illustrated in FIG. 5, for example.

The digital filter performs filter processing of any one of FIRF 11a to 11d illustrated in FIG. 6, for example. Alternatively, the digital filter performs filter processing of any one of FDF 73a to 11d illustrated in FIG. 13, for example. The filter coefficient is the aforementioned $h_{ij}$, for example. The coefficient update amount is the aforementioned $h_{ij}$, for example.

The filter coefficient update amount output device is the adaptive equalization unit 83 illustrated in FIG. 5 that outputs the coefficient update amount derivation result illustrated in FIG. 9, 10, 11, or 12, for example. The processed received sample value is the received sample value $y_i$ illustrated in FIG. 9, 10, 11, 12, or 14, or the received sample value $x_{1I}$, $x_{1Q}$, $x_{2I}$, or $x_{2Q}$ illustrated in FIG. 13, for example.

The temporary determination result is the result of the temporary determination 41 illustrated in FIG. 11 or 14, for example. The difference is the result of the subtraction 59 illustrated in FIG. 11 or 14, for example. The first coefficient update amount is the constant multiplication result by the constant multiplication 52a illustrated in FIG. 11 or 14, for example.

The first output unit is the adaptive equalization unit 83 illustrated in FIG. 5 that performs the constant multiplication 52a illustrated in FIG. 11 or 14, for example. The certain time width is the time width used for blocking by the blocking 57a or 57b illustrated in FIG. 9, 10, 11, or 12, for example. Alternatively, the time width is the time width used for the blocking by the overlapping/blocking 71 illustrated in FIG. 13, for example.

The statistical information is the result of the statistical processing 56 illustrated in FIG. 9 or 10, for example. The statistical information is the derivation result of the average intensity derivation 56a illustrated in FIG. 11 or 12, for example. The statistical information is the estimation result of the probability density estimation 56b illustrated in FIG. 12, for example.

The set value is the desired value illustrated in FIG. 9, for example. Alternatively, the set value is the average intensity P in the time width of the received symbol associated to the received sample value illustrated in FIG. 10, 11, or 14, for example. Alternatively, the set value is the desired probability density Pr(y) illustrated in FIG. 12, for example. The second coefficient update amount is the processing result by the constant multiplication 52b illustrated in FIG. 11 or 14, for example. The second output unit is the adaptive equalization unit 83 illustrated in FIG. 5 that outputs the processing result by the constant multiplication 52b illustrated in FIG. 11 or 14, for example.

The third output unit is the adaptive equalization unit 83 illustrated in FIG. 5 that outputs the result of the addition 51 illustrated in FIG. 9, 10, or 12, for example.

The desired value in Supplementary Note 2 is the desired value illustrated in FIG. 9, the average intensity P in the time width of the received symbol associated to the received sample value illustrated in FIG. 10, 11, or 14, or the desired probability density Pr(y) illustrated in FIG. 12, for example.

The Probabilistic Constellation Shaping signal in Supplementary Note 3 is the aforementioned PCS signal, for example. The blocking in Supplementary Note 4 is the blocking 57a or 57b illustrated in FIG. 9, 10, 11, or 12, or the overlapping/blocking 71 illustrated in FIG. 13, for example.

The average intensity of the received symbol is the average intensity P of the received symbol associated to the received sample values illustrated in FIG. 10, 11, or 14 in the time width, for example. The probability density derived in the kernel density estimation in Supplementary Note 5 is the result of the derivation of the average intensity derivation 56a illustrated in FIG. 11 or 14, for example.

One of FIRF 11a to 11d illustrated in FIG. 6 performs the filter processing in the time domain described in Supplementary Note 6, for example. One of FDF 73a to 73d illustrated in FIG. 13 performs the filter processing in the frequency domain described in Supplementary Note 7, for example.

The filter coefficient updating device in Supplementary Note 8 is the adaptive equalization unit illustrated in FIG. 5 that updates the filter coefficient using the coefficient update amount output from the filter coefficient update amount output device according to any one of appendices 1 to 7, for example. The equalization device in Supplementary Note 9 is the adaptive equalization unit 83 illustrated in FIG. 5 in which the filter coefficient updating device according to Supplementary Note 8 updates the filter coefficient.

The receiving device in Supplementary Note 10 is the optical receiver 130 described in Supplementary Note 2 including the equalization device in Supplementary Note 9. The communication system in Supplementary Note 11 is the combination of the optical transmitter 110 and the optical receiver 130 illustrated in FIG. 2, wherein the optical receiver 130 is used as the receiving device, for example.

The filter coefficient update amount outputting method according to Supplementary Note 12 is the outputting method of the coefficient update amount illustrated in FIG. 9, 10, 11, 12, or 14, for example.

The filter coefficient update amount output program according to Supplementary Note 13 is the aforementioned program for causing the aforementioned computer to output the coefficient update amount illustrated in FIG. 9, 10, 11, 12, or 14, for example.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2019-191623, filed on Oct. 21, 2019, the disclosure of which is incorporated herein in its entirety by reference.

REFERENCE SIGNS LIST

10 Complexification
11a, 11b, 11c, 11d FIRF
12 Coefficient update
13a, 13b Carrier phase compensation
14 Real and imaginary parts separation
15a, 15b, 51, 61, 74a, 74b Addition
21, 23 SP unit
22a, 22b, 22c, 22d Sub-encoding unit
24 DM unit
25 FEC encoding unit
26 MAP unit
31 Demodulation unit
32a, 32b, 32c, 32d Sub-decoding unit
33 FEC decoding unit
34 DDM unit
41 Temporary determination
43, 60, 62 Multiplication
44, 52a, 52b Constant multiplication
53 DDLMS
54 Gradient derivation
55 Difference derivation
56 Statistical processing
56a Average magnitude derivation
56b Probabilistic density estimation
57a, 57b Blocking
58 $x^*_j$
59 Subtraction
63 $\Sigma$
64a, 64b FFT
65 IFFT
66 0Pad
71 Overlapping/blocking
72a, 72b FFT
73a, 73b, 73c, 73d FDF
75 Constraint
76 Coefficient update
77a, 77b IFFT 78 Overlap removal/serialization
81 Front-end compensation unit
82 Wavelength dispersion compensation unit
83 Adaptive equalization unit
83x Filter coefficient update amount output device
83xa First output unit
83xb Second output unit
83xc Third output unit
100 Optical communication system
110 Optical transmitter
111 Encoding unit
112, 131 LD
113 Optical modulator
120 Transmission route
130 Optical receiver
132 Coherent receiver
133 ADC
134 Demodulation and decoding unit

What is claimed is:

1. A filter coefficient update amount output device configured to output a coefficient update amount being a value for updating a filter coefficient of a digital filter included in an equalization device configured to equalize a received sample value of a received signal received with coherent reception by means of digital data processing, the filter coefficient update amount output device comprising:
a first output unit configured to output a first coefficient update amount derived from a difference between a temporary determination result concerning a processed received sample value being the received sample value on which filter processing by the digital filter has been performed, and the processed received sample value;
a second output unit configured to output a second coefficient update amount derived from a gradient with respect to the filter coefficient in such a way as to minimize a magnitude of a difference between statistical information on the processed received sample value for a given time width, and a set value for the statistical information; and
a third output unit configured to output the coefficient update amount derived from the first coefficient update amount and the second coefficient update amount.

2. The filter coefficient update amount output device according to claim 1, wherein the set value is a desired value being an expected value for the statistical information.

3. The filter coefficient update amount output device according to claim 2, wherein the set value is based on a transmitted Probabilistic Constellation Shaping signal.

4. The filter coefficient update amount output device according to claim 2, wherein the statistical information is average intensity of a received symbol related to the blocked received sample value after processing.

5. The filter coefficient update amount output device according to claim 2, wherein the statistical information is probability density derived from kernel density estimation of a blocked received symbol.

6. The filter coefficient update amount output device according to claim 2, wherein the digital filter performs time-domain filter processing.

7. The filter coefficient update amount output device according to claim 1, wherein the set value is based on a transmitted Probabilistic Constellation Shaping signal.

8. The filter coefficient update amount output device according to claim 7, wherein the statistical information is average intensity of a received symbol related to the blocked received sample value after processing.

9. The filter coefficient update amount output device according to claim 7, wherein the statistical information is probability density derived from kernel density estimation of a blocked received symbol.

10. The filter coefficient update amount output device according to claim 7, wherein the digital filter performs time-domain filter processing.

11. The filter coefficient update amount output device according to claim 1, wherein the statistical information is average intensity of a received symbol related to the blocked received sample value after processing.

12. The filter coefficient update amount output device according to claim 1, wherein the statistical information is probability density derived from kernel density estimation of a blocked received symbol.

13. The filter coefficient update amount output device according to claim 1, wherein the digital filter performs time-domain filter processing.

14. The filter coefficient update amount output device according to claim 1, wherein the digital filter performs frequency-domain filter processing.

15. A filter coefficient update device configured to update the filter coefficient by means of the filter coefficient update amount output device according to claim 1.

16. An equalization device comprising the filter coefficient update device according to claim 15 and the digital filter.

17. A receiving device comprising the equalization device according to claim 16.

18. A communication system comprising the receiving device according to claim 17.

19. A filter coefficient update amount output method of outputting a coefficient update amount being a value for updating a filter coefficient of a digital filter included in an equalization device configured to equalize a received sample value of a received signal received with coherent reception by means of digital data processing, the filter coefficient update amount output method comprising:
performing first output for outputting a first coefficient update amount derived from a difference between a temporary determination result concerning a processed received sample value being the received sample value on which filter processing by the digital filter has been performed, and the processed received sample value;
performing second output for outputting a second coefficient update amount derived from a gradient with respect to the filter coefficient in such a way as to minimize a magnitude of a difference between statistical information on the processed received sample value for a given time width, and a set value for the statistical information; and
performing third output for outputting the coefficient update amount derived from the first coefficient update amount and the second coefficient update amount.

20. A recording medium recording a filter coefficient update amount output program causing a computer to perform filter coefficient update amount output for outputting a coefficient update amount being a value for updating a filter coefficient of a digital filter included in an equalization device configured to equalize a received sample value of a received signal received with coherent reception by means of digital data processing, the program causing the computer to perform:
processing of performing first output for outputting a first coefficient update amount derived from a difference between a temporary determination result concerning a processed received sample value being the received sample value on which filter processing by the digital filter has been performed, and the processed received sample value;

processing of performing second output for outputting a second coefficient update amount derived from a gradient with respect to the filter coefficient in such a way as to minimize a magnitude of a difference between statistical information on the processed received sample value for a given time width, and a set value for the statistical information; and processing of performing third output for outputting the coefficient update amount derived from the first coefficient update amount and the second coefficient update amount.

* * * * *